United States Patent
Yanagawa et al.

(10) Patent No.: US 10,720,418 B2
(45) Date of Patent: Jul. 21, 2020

(54) RESISTANCE CIRCUIT, OSCILLATION CIRCUIT, AND IN-VEHICLE SENSOR APPARATUS

(71) Applicant: HITACHI AUTOMOTIVE SYSTEMS, LTD., Hitachinaka-shi, Ibaraki (JP)

(72) Inventors: Yoshimitsu Yanagawa, Tokyo (JP); Yoshikazu Nara, Tokyo (JP); Masahiro Matsumoto, Tokyo (JP); Hiroshi Nakano, Tokyo (JP); Akira Kotabe, Ibaraki (JP)

(73) Assignee: HITACHI AUTOMOTIVE SYSTEMS LTD., Ibaraki (JP)

( * ) Notice: Subject to any disclaimer, the term of this patent is extended or adjusted under 35 U.S.C. 154(b) by 0 days.

(21) Appl. No.: 16/495,564

(22) PCT Filed: Sep. 12, 2017

(86) PCT No.: PCT/JP2017/032785
§ 371 (c)(1),
(2) Date: Sep. 19, 2019

(87) PCT Pub. No.: WO2018/173324
PCT Pub. Date: Sep. 27, 2018

(65) Prior Publication Data
US 2020/0013769 A1   Jan. 9, 2020

(30) Foreign Application Priority Data
Mar. 22, 2017   (JP) .................................. 2017-056237

(51) Int. Cl.
*H01L 27/01* (2006.01)
*H01L 49/02* (2006.01)
(Continued)

(52) U.S. Cl.
CPC .......... *H01L 27/01* (2013.01); *H01L 27/0802* (2013.01); *H01L 27/101* (2013.01);
(Continued)

(58) Field of Classification Search
CPC ..... H01L 28/20; H01L 27/01; H01L 27/0802; H01L 27/101; H01C 13/00; H01C 13/02;
(Continued)

(56) References Cited

U.S. PATENT DOCUMENTS 3,965,453 A * 6/1976 Seidel ................. H01L 27/0802
338/13
7,437,260 B2 * 10/2008 Ausserlechner ...... G01L 5/0047
257/427
8,970,266 B2 * 3/2015 Yayama ................. H01C 13/02
327/113

FOREIGN PATENT DOCUMENTS

JP    06-045527 A   2/1994
JP    06-097368 A   4/1994
JP    2014-225610 A   12/2014

OTHER PUBLICATIONS

Motz, Mario, and Udo Ausserlechner. "Electrical compensation of mechanical stress drift in precision analog circuits." Wideband Continuous-time ΣΔ ADCs, Automotive Electronics, and Power Management. Springer, Cham, 2017. 297-326. (Year: 2017).*

* cited by examiner

*Primary Examiner* — Ryan Johnson
(74) *Attorney, Agent, or Firm* — Volpe and Koenig, P.C.

(57) ABSTRACT

A resistance circuit is configured such that a P-type resistance section and an N-type resistance section are electrically connected in series, the P-type resistance section is configured with P-type diffusion layer resistance elements that are disposed to form a right angle with respect to each other and that are electrically connected in series, and the (Continued)

N-type resistance section is configured with N-type diffusion layer resistance elements that are disposed to form the right angle with respect to each other and that are electrically connected in series. Furthermore, the P-type diffusion layer resistance element is disposed along a <100> orientation direction of a semiconductor substrate, and the N-type diffusion layer resistance element is disposed along a <110> orientation direction of the semiconductor substrate. It is thereby possible to provide the resistance circuit, an oscillation circuit, and an in-vehicle sensor apparatus that reduce stress-induced characteristic fluctuations.

13 Claims, 14 Drawing Sheets

(51) Int. Cl.
  *H01L 27/08* (2006.01)
  *H01L 27/10* (2006.01)
  *H03K 3/011* (2006.01)
  *H03K 3/354* (2006.01)
  *H03K 4/52* (2006.01)
  *H03B 5/24* (2006.01)

(52) U.S. Cl.
  CPC ............... *H01L 28/20* (2013.01); *H03B 5/24* (2013.01); *H03K 3/011* (2013.01); *H03K 3/354* (2013.01); *H03K 4/52* (2013.01)

(58) Field of Classification Search
  CPC .......... H01C 7/00; H03B 5/24; H03K 3/0315; H03K 3/0231; H03K 3/011; H03K 3/354; H03K 4/52
  See application file for complete search history.

RESISTANCE CIRCUIT, OSCILLATION CIRCUIT, AND IN-VEHICLE SENSOR APPARATUS

TECHNICAL FIELD

The present invention relates to a resistance circuit, an oscillation circuit, and an in-vehicle sensor apparatus, and particularly relates to a resistance circuit, an oscillation circuit, and an in-vehicle sensor apparatus that mitigate stress-induced characteristic fluctuations at a time of mounting.

BACKGROUND ART

As background art of the present technical field, there is known JP-1994-45527-A (Patent Document 1). Patent Document 1 describes a semiconductor device configured such that a p-type bent resistance element is formed outside of a p-type diffusion region formed on an n-type epitaxial layer, an n-type bent resistance element is formed on the p-type diffusion region, and the p-type bent resistance element and the n-type bent resistance element are connected by an aluminum interconnection.

PRIOR ART DOCUMENT

Patent Document
Patent Document 1: JP-1994-45527-A

SUMMARY OF THE INVENTION

Problems to be Solved by the Invention

When a stress is applied to a resistance element formed on a semiconductor chip, a resistance value of the resistance element fluctuates by the piezoresistance effect. Owing to this, in a case of encapsulating the semiconductor chip in a package, a package material generates a stress in the semiconductor chip, possibly resulting in a deviation of an actual resistance value of the resistance element from a design value. A fluctuation in the resistance value of the resistance element in such a circuit that operates with reference to the resistance value of the resistance element causes a change in characteristics of the circuit. For example, in an RC oscillator using a resistance element and a capacitance element, an oscillating frequency changes by the change in the resistance value of the resistance element. To prevent such a characteristic change, it is necessary to reduce the influence of the stress on the resistance element.

It is, however, difficult to strictly control the resistance value of the resistance element. This is because a variation in a manufacturing process leads to a variation in the resistance value of the resistance element. Even with the technique described in Patent Document 1, if the resistance value of the resistance element varies depending on the variation in the manufacturing process, there is a concern of a change in a ratio of the resistance value of the p-type bent resistance element to that of the n-type bent resistance element, with the result that a cancel effect of the change in the resistance values with respect to the stress falls.

Means for Solving the Problems

To solve the problems, a resistance circuit according to the present invention includes an N-type resistance section and a P-type resistance section that are electrically connected in series. The N-type resistance section has a first N-type diffusion layer resistance element and a second N-type diffusion layer resistance element that are disposed to form a right angle with respect to each other and that are electrically connected in series, and the P-type resistance section has a first P-type diffusion layer resistance element and a second P-type diffusion layer resistance element that are disposed to form the right angle with respect to each other and that are electrically connected in series. Furthermore, the first N-type diffusion layer resistance element is disposed along a <110> orientation direction and the first P-type diffusion layer resistance element is disposed along a <100> orientation direction.

Effect of the Invention

According to the present invention, it is possible to provide a resistance circuit, an oscillation circuit, and an in-vehicle sensor apparatus that can reduce stress-induced characteristic fluctuations.

Problems, configurations, and effects other than those described above are readily apparent from the description of embodiments given below.

MODES FOR CARRYING OUT THE INVENTION

Figure 1:
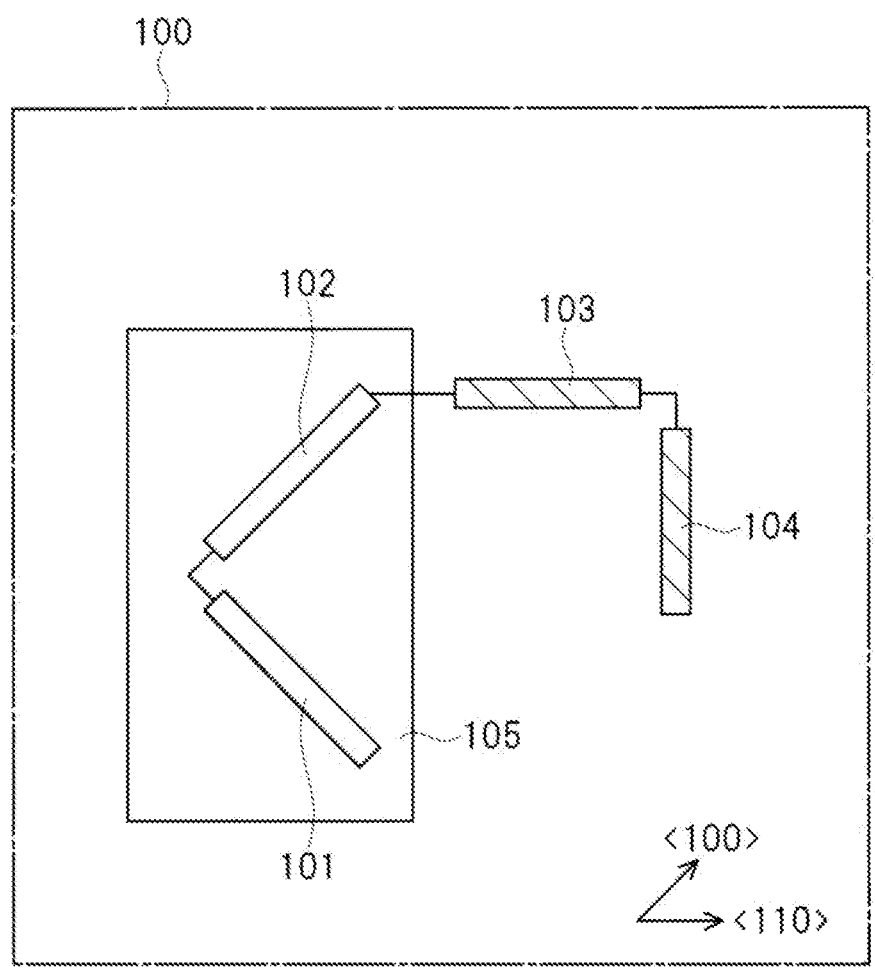
FIG. 1 is a plan view depicting disposition of P-type diffusion layer resistance elements and N-type diffusion layer resistance elements that configure a resistance circuit according to a first embodiment.

Embodiments will be described in detail hereinafter on the basis of the drawings. In all the drawings for describing the embodiments, members having same functions are denoted by same or relevant reference characters and are not repeatedly described. Furthermore, in a case in which a plurality of similar members (sites) are present, signs are often added to generic reference characters to indicate individual or specific sites. Moreover, in the following embodiments, same or similar parts are not repeatedly described in principle except for the situation where there is a particular need.

Furthermore, in the drawings used in the embodiments, hatching is often omitted even in a cross-sectional view to make the view easy to see. Moreover, hatching is often added even to a plan view to make the view easy to see.

Further, in a cross-sectional view or a plan view, a magnitude of each site does not necessarily correspond to that in an actual device and a specific site is often relatively enlarged to make the view easy to understand. Moreover, even in a case in which a cross-sectional view corresponds to a plan view, a specific site is often enlarged relatively to make the views easy to understand.

First Embodiment

Figure 2:
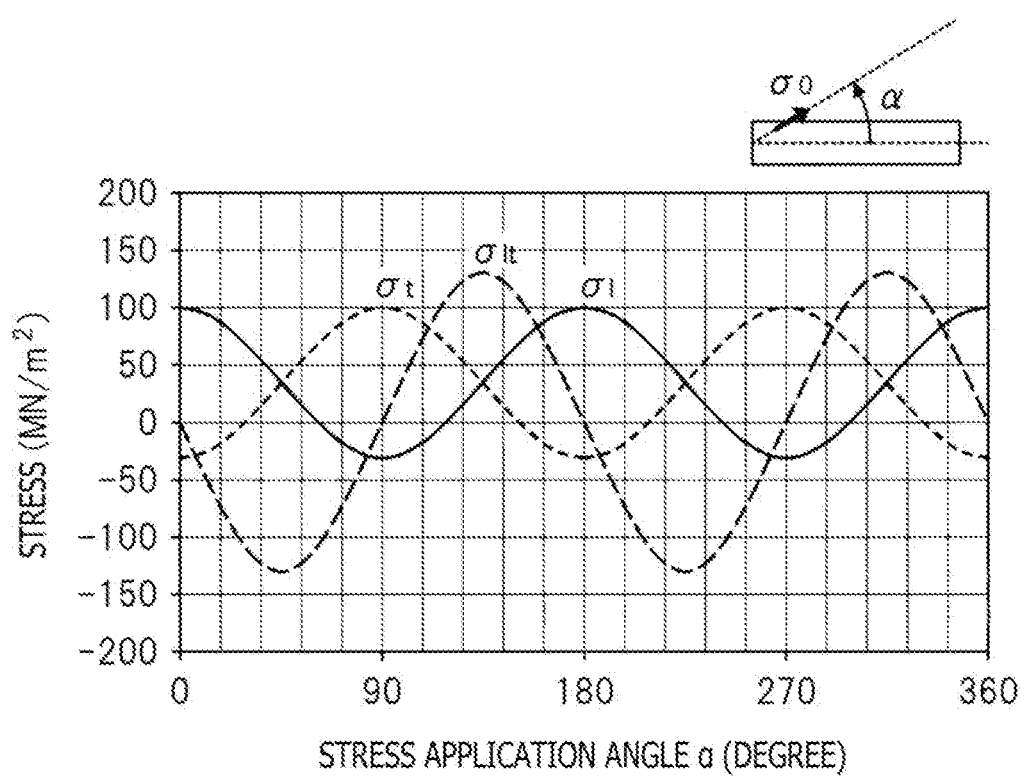
FIG. 2 is a graph chart depicting changes in a shear stress and normal stresses at a time of applying stresses to a resistance element.
Figure 4:
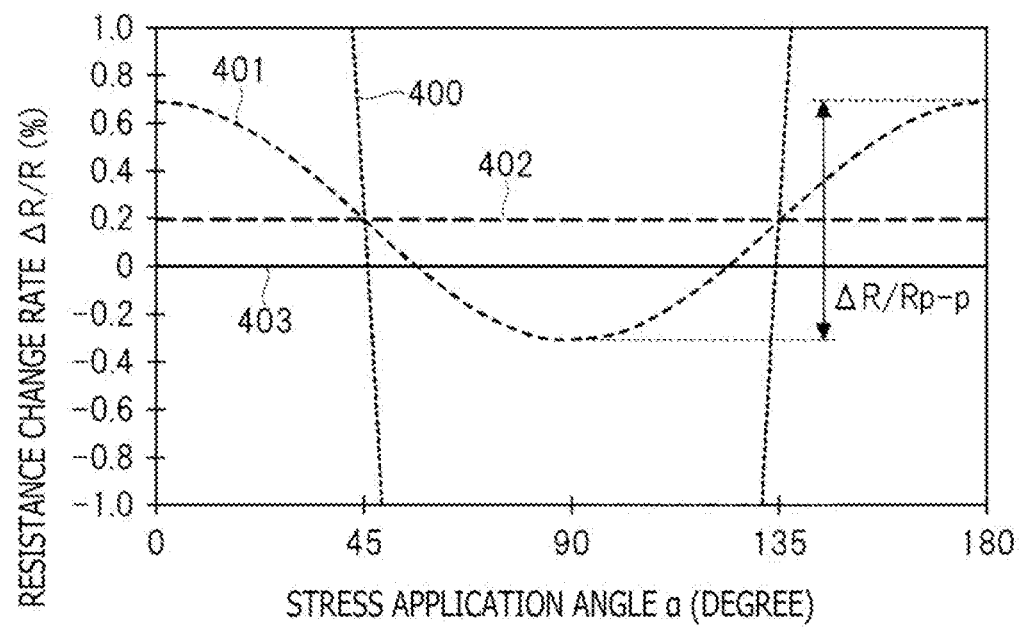
FIG. 4 is a graph chart depicting a relationship between a resistance change rate and a stress application angle at the time of applying stresses to the resistance element.
Figure 5:
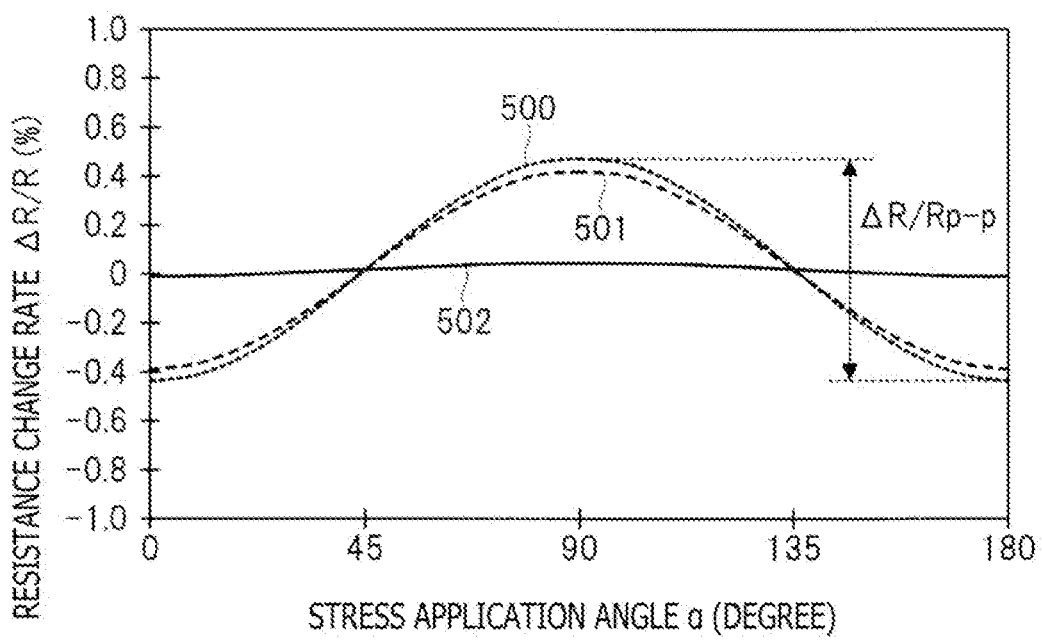
FIG. 5 is a graph chart depicting the relationship between the resistance change rate and the stress application angle at the time of applying the stresses to the resistance element.

Features of a resistance circuit according to a first embodiment will be described with reference to FIGS. 1 to 5. FIG. 1 is a plan view depicting disposition of P-type diffusion layer resistance elements and N-type diffusion layer resistance elements that configure the resistance circuit according to the first embodiment. FIG. 2 is a graph chart depicting changes in a shear stress and normal stresses at a time of applying stresses to a resistance element, and in FIG. 2, $\sigma_{lt}$ denotes the shear stress and $\sigma_t$ and $\sigma_l$ denote the normal stresses. FIGS. 3A, 3B, 3C, and 3D are diagrams depicting crystal axis anisotropies of piezoresistance coefficients of the P-type diffusion layer resistance element and the N-type diffusion layer resistance element. FIGS. 4 and 5 are graph charts depicting a relationship between a resistance change rate and a stress application angle at the time of applying stresses to the resistance element.

A configuration of the resistance circuit according to the first embodiment will first be described with reference to FIG. 1.

The resistance circuit according to the first embodiment is configured with two P-type diffusion layer resistance elements 101 and 102 and two N-type diffusion layer resistance elements 103 and 104 formed on a principal surface of a semiconductor substrate 100. The P-type diffusion layer resistance elements 101 and 102 and the N-type diffusion layer resistance elements 103 and 104 are formed within wells formed in the semiconductor substrate 100 as needed and electrically isolated from the semiconductor substrate 100 by the wells. In a case, for example, in which a conduction type of the semiconductor substrate 100 is P-type, the P-type diffusion layer resistance elements 101 and 102 are disposed within an N-type well 105 as depicted in FIG. 1 and the N-type well 105 is kept at an appropriate potential by a power feed terminal.

The P-type diffusion layer resistance elements 101 and 102 are disposed to extend along a <100> orientation direction of the semiconductor substrate 100. On the other hand, the N-type diffusion layer resistance elements 103 and 104 are disposed to extend along a <110> orientation direction of the semiconductor substrate 100. Furthermore, the P-type diffusion layer resistance elements 101 and 102 and the N-type diffusion layer resistance elements 103 and 104 are connected in series.

Features of the resistance circuit according to the first embodiment, operation thereof at a time of applying stresses thereto, and effects thereof will next be described with reference to FIGS. 2 to 5.

A resistance change of a resistance element by the piezoresistance effect, that is, a stress sensitivity of the resistance element can be expressed by the following theoretical Equation (1).

[Equation 1]

$$\frac{\Delta R}{R} = \pi_l \sigma_l + \pi_t \sigma_t + \pi_z \sigma_z + \pi_s \sigma_{lt} \qquad (1)$$

In Equation (1), $\pi_l$, $\pi_t$, $\pi_z$, and $\pi_s$ denote piezoresistance coefficients of the resistance element in a longitudinal direction, a transverse direction, a perpendicular direction, and a shear direction, respectively. In addition, $\sigma_l$, $\sigma_t$, $\sigma_z$, and $\sigma_{lt}$ denote stresses applied to the resistance element in the longitudinal direction, the transverse direction, the perpendicular direction, and the shear direction, respectively. It is noted, however, that the piezoresistance coefficient $\pi_z$ and the stress $\sigma_z$ are not considered hereinafter because of small influence on the resistance change of the resistance element.

The piezoresistance coefficient $\pi_l$, $\pi_t$, and $\pi_s$ can be calculated by Equations (2) to (5).

[Equation 2]

$$\pi_l = \pi_{11} - 2(\pi_{11} - \pi_{12} - \pi_{44})\{(l_1 m_1)^2 + (m_1 n_1)^2 + (n_1 l_1)^2\} \qquad (2)$$

[Equation 3]

$$\pi_t = \pi_{12} + (\pi_{11} - \pi_{12} - \pi_{44})\{(l_1 l_2)^2 + (m_1 m_2)^2 + (n_1 n_2)^2\} \qquad (3)$$

[Equation 4]

$$\pi_s = 2(\pi_{11} - \pi_{12} - \pi_{44})(l_1^3 l_2 + m_1^3 m_2 + n_1^3 n_2) \qquad (4)$$

-continued

[Equation 5]

$$\begin{bmatrix} l_1 & m_1 & n_1 \\ l_2 & m_2 & n_2 \\ l_3 & m_3 & n_3 \end{bmatrix} = \begin{bmatrix} \cos\phi\cos\theta\cos\psi - \sin\phi\sin\psi & \sin\phi\cos\theta\cos\psi + \cos\phi\sin\psi & -\sin\theta\cos\psi \\ -\cos\phi\cos\theta\sin\psi - \sin\phi\cos\psi & -\sin\phi\cos\theta\sin\psi + \cos\phi\cos\psi & \sin\theta\sin\psi \\ \cos\phi\sin\theta & \sin\phi\sin\theta & \cos\theta \end{bmatrix} \quad (5)$$

In Equations (2) to (5), $\pi_{11}$, $\pi_{12}$, and $\pi_{44}$ denote piezoresistance coefficients related to a fundamental crystal axis of silicon and are constants determined by an impurity concentration and a temperature. $l_1$, $l_2$, $l_3$, $m_1$, $m_2$, $m_3$, $n_1$, $n_2$, and $n_3$ denote coefficients of coordinate transform for the fundamental crystal axis of silicon and can be obtained from Equation (5) using Euler angles $\varphi$, $\theta$, and $\psi$. In a case of forming a resistance element on a principal surface of a silicon wafer in an ordinary (100) plane, $\varphi=0$ degree and $\theta=90$ degrees; thus, Equations (2) to (4) are simplified using Equation (5) as follows.

[Equation 6]

$$\pi_l = \pi_{11} - 2(\pi_{11} - \pi_{12} - \pi_{44})(\cos^2\psi \sin^2\psi) \quad (6)$$

[Equation 7]

$$\pi_t = \pi_{12} + (\pi_{11} - \pi_{12} - \pi_{44})(2\cos^2\psi \sin^2\psi) \quad (7)$$

[Equation 8]

$$\pi_s = 2(\pi_{11} - \pi_{12} - \pi_{44})(\sin^3\psi\cos\psi - \cos^3\psi\sin\psi) \quad (8)$$

Equations (2) to (4) are simplified to Equations (6) to (8), respectively.

In Equations (6) to (8), $\psi$ denotes a variable representing a disposition angle of the resistance element in the wafer plane.

Let us now consider two resistance elements, that is, resistance elements A and B disposed to form a right angle with respect to each other. The resistance elements A and B are the same in shape and type and resistance values thereof are R. If it is assumed that a disposition angle of the resistance element A is $\psi$ and that of the resistance element B is $\psi+90$ degrees, a piezoresistance coefficient $\pi_{lA}$ of the resistance element A is equal to a piezoresistance coefficient $\pi_{lB}$ of the resistance element B as expressed by Equations (9) and (10).

[Equation 9]

$$\pi_{lA} = \pi_{11} - 2(\pi_{11} - \pi_{12} - \pi_{44})(\cos^2\psi\sin^2\psi) \quad (9)$$

[Equation 10]

$$\pi_{lB} = \pi_{11} - 2(\pi_{11} - \pi_{12} - \pi_{44})\{\cos^2(\psi+90)\sin^2(\psi+90)\} \quad (10)$$
$$= \pi_{11} - 2(\pi_{11} - \pi_{12} - \pi_{44})(\sin^2\psi\cos^2\psi)$$
$$= \pi_{lA}$$

Likewise, if the piezoresistance coefficient $\pi_t$ is simplified, a piezoresistance coefficient $\pi_{tA}$ of the resistance element A is equal to a piezoresistance coefficient $\pi_{tB}$ of the resistance element B.

[Equation 11]

$$\pi_{tA} = \pi_{tB} \quad (11)$$

Likewise, if the piezoresistance coefficient $\pi_s$ is simplified, a piezoresistance coefficient $\pi_{sA}$ of the resistance element A is equal to a piezoresistance coefficient $\pi_{sB}$ of the resistance element B.

[Equation 12]

$$\pi_{sA} = \pi_{sB} \quad (12)$$

Therefore, a rate of fluctuation of the resistance value of the resistance element A under stress is expressed by Equation (13) using Equation (1).

[Equation 13]

$$\frac{\Delta R_A}{R} = \pi_{lA}\sigma_{lA} + \pi_{tA}\sigma_{tA} - \pi_{sA}\sigma_{ltA} \quad (13)$$

Moreover, a rate of fluctuation of the resistance value of the resistance element B under stress is expressed by Equation (14) using Equation (1).

[Equation 14]

$$\frac{\Delta R_B}{R} = \pi_{lA}\sigma_{lB} + \pi_{tA}\sigma_{tB} - \pi_{sA}\sigma_{ltB} \quad (14)$$

Next, in a case of assuming that a stress $\sigma_0$ is applied to the resistance element A in a direction of an angle $\alpha$ with respect to the longitudinal direction of the resistance element A, a stress (normal stress) $\sigma_{lA}$ in the longitudinal direction, a stress (normal stress) $\sigma_{tA}$ in the transverse direction, and a stress (shear stress) $\sigma_{ltA}$ in the shear direction applied to the resistance element A are expressed by Equations (15), (16), and (17), respectively.

[Equation 15]

$$\sigma_{lA} = \sigma\cos^2\alpha + v\sigma_o\sin^2\alpha \quad (15)$$

[Equation 16]

[Equation 17]

$$\sigma_{ltA} = -2(\sigma_0 - v\sigma_0)\sin\alpha\cos\alpha \quad (17)$$

In Equations (15) to (17), $v$ denotes a Poisson's ratio of silicon, which is approximately 0.3.

A stress $\sigma_0$ is applied to the resistance element B in a direction of an angle $(\alpha+90)$ degrees; thus, similarly to the piezoresistance coefficients, a stress (normal stress) $\sigma_{lB}$ in the longitudinal direction, a stress (normal stress) $\sigma_{tB}$ in the transverse direction, and a stress (shear stress) $\sigma_{ltB}$ in the shear direction applied to the resistance element B are calculated and simplified as follows.

[Equation 18]

$$\sigma_{lB} = \sigma_0\cos^2(\alpha+90) + v\sigma_0\sin^2(\alpha+90) \quad (18)$$
$$= \sigma_0\sin^2\alpha + v\sigma_0\cos^2\alpha$$
$$= \sigma_{tA}$$

[Equation 19]

$$\sigma_{tB} = \sigma_0 \sin^2(\alpha + 90) + v\sigma_0 \cos^2(\alpha + 90) \quad (19)$$
$$= \sigma_0 \cos^2\alpha + v\sigma_0 \sin^2\alpha$$
$$= \sigma_{tA}$$

[Equation 20]

$$\sigma_{ltB} = -2(\sigma_0 - v\sigma_0)\sin(\alpha + 90)\cos(\alpha + 90) \quad (20)$$
$$= 2(\sigma_0 - v\sigma_0)\cos\alpha\sin\alpha$$
$$= -\sigma_{ltA}$$

Equations (15) to (17) are simplified to Equations (18) to (20), respectively.

From Equations (13) and (14), a total resistance change $\Delta R_{TOT}$ at a time of connecting the resistance elements A and B in series is expressed by Equation (21).

[Equation 21]

$$\Delta R_{TOT} = R\frac{\Delta R_A}{R} + R\frac{\Delta R_B}{R} \quad (21)$$
$$= R(\pi_{lA}\sigma_{lA} + \pi_{tA}\sigma_{tA} + \pi_{sA}\sigma_{ltA} + \pi_{lA}\sigma_{lB} + \pi_{tA}\sigma_{tB} - \pi_{sA}\sigma_{ltB})$$

By substituting Equations (15) to (20), (6), and (7) into Equation (21) for organization, the total resistance change $\Delta R_{TOT}$ is expressed by Equation (22).

[Equation 22]

$$\Delta R_{TOT} = R(\pi_{lA}\sigma_{lA} + \pi_{tA}\sigma_{tA} + \pi_{sA}\sigma_{ltA} + \pi_{lA}\sigma_{tA}\sigma + \pi_{tA}\sigma_{lA} - \pi_{sA}\sigma_{ltA}) \quad (22)$$
$$= R(\pi_{lA} + \pi_{tA})(\sigma_{lA} + \sigma_{tA})$$
$$= R\sigma_0(\pi_{lA} + \pi_{tA})(1 + v)$$
$$= R\sigma_0(\pi_{11} + \pi_{12})(1 + v)$$

As depicted in Equation (22), it can be understood that combining the two resistance elements disposed to form the right angle with respect to each other and the same in shape and type causes components related to the shear stress to be cancelled, and that the constants which do not contain terms related to the disposition angle ψ and the stress application angle α remain in the total resistance change $\Delta R_{TOT}$.

Next, let us consider further cancelling the remaining resistance change components. Since the P-type diffusion layer resistance element and the N-type diffusion layer resistance element are generally opposite in a polarity of a gauge factor, combining these resistance elements at an appropriate resistance ratio enables a stress-induced resistance change amount to be close to zero. When two P-type diffusion layer resistance elements (hereinafter, often referred to as "P-type diffusion layer resistance element pair") forming a right angle with respect to each other and connected in series and two N-type diffusion layer resistance elements (hereinafter, often referred to as "N-type diffusion layer resistance element pair") forming the right angle with respect to each other and connected in series are connected in series, a total resistance change $\Delta R_{TOT\_NP}$ is expressed by Equation (23). $R_P$ denotes a resistance value of each P-type diffusion layer resistance element and $R_N$ denotes a resistance value of the N-type diffusion layer resistance element pair.

[Equation 23]

$$\Delta R_{TOT\_NP} = R_P\sigma_0(\pi_{11\_P} + \pi_{12\_P})(1 + v) + \quad (23)$$
$$R_N\sigma_0(\pi_{11\_N} + \pi_{12\_N})(1 + v)$$
$$= \sigma_0(1 + v)\{R_P(\pi_{11\_P} + \pi_{12\_P}) + R_N(\pi_{11\_N} + \pi_{12\_N})\}$$

In general, the P-type diffusion layer resistance element and the N-type diffusion layer resistance element are opposite in a polarity of the stress-induced resistance change. Furthermore, while a resistance change amount of the N-type diffusion layer resistance element is larger than that of the P-type diffusion layer resistance element, the resistance change $\Delta R_{TOT\_NP}$ can be efficiently reduced by, for example, setting the resistance value of the P-type diffusion layer resistance element larger than that of the N-type diffusion layer resistance element and combining the P-type diffusion layer resistance elements and the N-type diffusion layer resistance elements. More preferably, selecting a ratio of the resistance value $R_P$ to the resistance value $R_N$ on the basis of the following Equation (24) causes the total resistance change $\Delta R_{TOT\_NP}$ depicted in Equation (23) to become zero and makes it possible to cancel stress dependence of the resistance values.

[Equation 24]

$$\frac{R_P}{R_N} = \frac{|\pi_{11\_N} + \pi_{12\_N}|}{|\pi_{11\_P} + \pi_{12\_P}|} \quad (24)$$

Next, as for a method of resolving the stress dependence of the resistance values described so far, an example of calculation results obtained on the basis of actual physical constants will be described.

FIG. 2 depicts calculation results of the shear stress $\sigma_{lt}$, the normal stress $\sigma_t$, and the normal stress $\sigma_l$ at a time of applying a stress $\sigma_0$=100 MN/m² to the resistance element in a direction of an angle α with respect to the longitudinal direction of the resistance element. It is noted that the Poisson's ratio of silicon is assumed as 0.3.

Figure 3A:
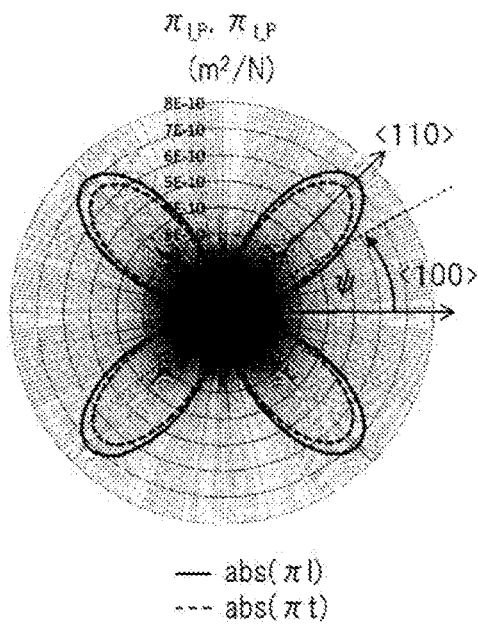
FIGS. 3A, 3B, 3C, and 3D are diagrams depicting crystal axis anisotropies of piezoresistance coefficients of the P-type diffusion layer resistance element and the N-type diffusion layer resistance element.
Figure 3B:
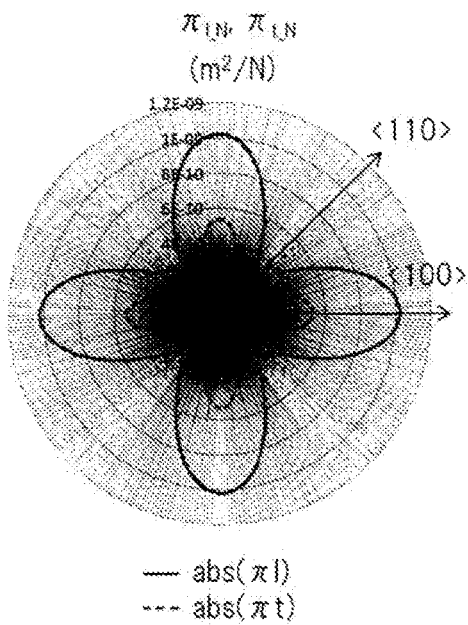
Figure 3C:
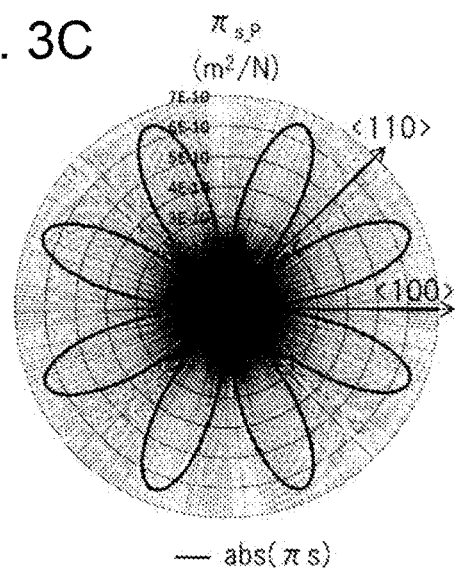
Figure 3D:
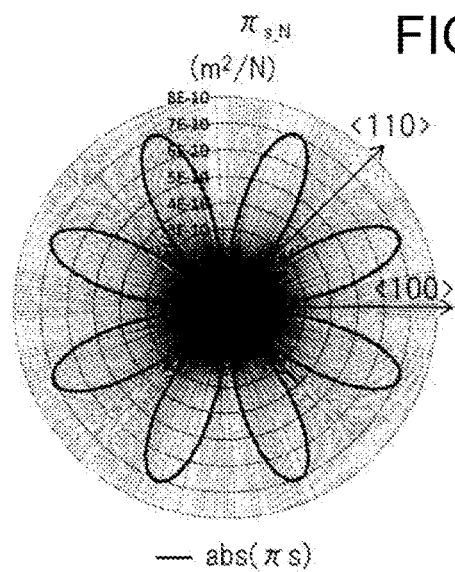

FIGS. 3A, 3B, 3C, and 3D depict crystal axis anisotropies of the piezoresistance coefficients of the P-type diffusion layer resistance element and the N-type diffusion layer resistance element, and the disposition angle ψ when a <100> orientation direction of a fundamental crystal axis as a reference is obtained as a parameter. FIG. 3A depicts the crystal axis anisotropies of the piezoresistance coefficients $\pi_{l\_P}$ and $\pi_{t\_P}$ of the P-type diffusion layer resistance element. FIG. 3B depicts the crystal axis anisotropies of the piezoresistance coefficients $\pi_{l\_N}$ and $\pi_{t\_N}$ of the N-type diffusion layer resistance element. FIG. 3C depicts the crystal axis anisotropy of a piezoresistance coefficient $\pi_{s\_P}$ of the P-type diffusion layer resistance element. FIG. 3D depicts the crystal axis anisotropy of a piezoresistance coefficient $\pi\pi_{s\_N}$ of the N-type diffusion layer resistance element. It is assumed herein that:

$\pi_{11\_P}$=6.6×10⁻¹¹ m²/N, $\pi_{12\_P}$=−1.1×10⁻¹¹ m²/N, $\pi_{44\_P}$=138.1×10⁻¹¹ m²/N, $\pi_{11\_N}$=−102.2×10⁻¹¹ m²/N, $\pi_{12\_N}=53.4\times10^{-11}$ m²/N, and $\pi_{44\_N}=-13.6\times10^{-11}$ m²/N, on the basis of Non-Patent Document (Y. Kanda, "A Graphical Representation of the Piezoresistance Coefficients in Silicon" IEEE Trnas. Elec. Dev., Vol. ED-29, No. 1, January, 1982).

As depicted in FIGS. 3A, 3B, 3C, and 3D, the piezoresistance coefficients of the P-type diffusion layer resistance element and the N-type diffusion layer resistance element each have angle dependence with respect to the crystal axis direction. In a case of disposing the P-type diffusion layer resistance element along the <100> orientation direction, The piezoresistance coefficients $\pi_l$ and $\pi_t$ of the P-type diffusion layer resistance element become minimum, that is, stress sensitivities become minimum. In a case of disposing the N-type diffusion layer resistance element along the <110> orientation direction, the piezoresistance coefficient $\pi_l$ of the N-type diffusion layer resistance element becomes minimum. Furthermore, the angle dependence of the piezoresistance coefficient $\pi_s$ of the P-type diffusion layer resistance element with respect to the crystal axis direction tends to be the same as the angle dependence of the piezoresistance coefficient $\pi_s$ of the N-type diffusion layer resistance element with respect to the crystal axis direction. The piezoresistance coefficient $\pi_s$ of the P-type diffusion layer resistance element becomes zero whether the P-type diffusion layer resistance element is disposed along the <100> orientation direction or <110> orientation direction, and the piezoresistance coefficient $\pi_s$ of the N-type diffusion layer resistance element becomes zero whether the N-type diffusion layer resistance element is disposed along the <100> orientation direction or the <110> orientation direction.

FIG. 4 depicts results of calculating resistance change rates ΔR/R at a time of applying stresses to various resistance elements on the basis of the calculation results depicted in FIGS. 2, 3A, 3B, 3C, and 3D. A peak-to-peak value of the resistance change rate ΔR/R relative to the stress application angle α is expressed as $\Delta R/R_{p-p}$, hereinafter.

In FIG. 4, reference character 400 denotes the resistance change rate ΔR/R in a case of disposing a single P-type diffusion layer resistance element along the <110> orientation direction in which the stress sensitivity becomes maximum, and $\Delta R/R_{p-p}$ reaches 18%. On the other hand, in FIG. 4, reference character 401 denotes the resistance change rate ΔR/R in a case of disposing the single P-type diffusion layer resistance element along the <100> orientation direction in which the stress sensitivity becomes minimum. In the case of disposing the single P-type diffusion layer resistance element along the <100> orientation direction, then $\Delta R/R_{p-p}$ is 1%, and the stress application angle dependence of the resistance value is greatly diminished, compared with the case of disposing the single P-type diffusion layer resistance element along the <110> orientation direction.

In FIG. 4, reference character 402 denotes the resistance change rate ΔR/R of two P-type diffusion layer resistance elements (P-type diffusion layer resistance element pair) forming the right angle with respect to each other and connected in series. While $\Delta R/R_{p-p}$ is 0% and the stress application angle dependence of the resistance value is resolved but an offset ΔR/R=0.2% remains.

In FIG. 4, reference character 403 denotes the resistance change rate ΔR/R in a case of connecting, in series, two P-type diffusion layer resistance elements (P-type diffusion layer resistance element pair) forming the right angle with respect to each other and connected in series and two N-type diffusion layer resistance elements (N-type diffusion layer resistance element pair) forming the right angle with respect to each other and connected in series. The resistance value of the P-type diffusion layer resistance element pair is set 8.87 times as large as that of the N-type diffusion layer resistance element pair. This is a value obtained by Equation (24) on the basis of the previous considerations. As depicted in FIG. 4, the offset remaining in the P-type diffusion layer resistance element pair (denoted by reference character 402) is removed, so that the stress application angle dependence of the resistance value is completely resolved.

Discussions given so far are applicable to a case of an ideal resistance having a resistance value as designed. Actually, however, the resistance value deviates from an ideal design value due to variations in manufacturing processes. To realize the stable resistance elements each with the less stress application angle dependence of the resistance value even under the presence of variations, disposition directions of the P-type diffusion layer resistance element pair and the N-type diffusion layer resistance element pair with respect to a wafer crystal axis may be specified.

Specifically, as depicted in FIG. 1, the P-type diffusion layer resistance element pair may be disposed along the <100> orientation direction in which the stress sensitivities become minimum and the N-type diffusion layer resistance element pair may be disposed along the <110> orientation direction in which the stress sensitivities become minimum.

FIG. 5 depicts results of calculating the resistance change rate ΔR/R relative to the stress application angle α in a case in which the resistance value of the P-type diffusion layer resistance element pair deviates by 1% and in which the resistance value of the N-type diffusion layer resistance element pair deviates by 1%.

In FIG. 5, reference character 500 denotes the resistance change rate ΔR/R in a case of disposing the P-type diffusion layer resistance element pair along the <110> orientation direction in which the stress sensitivities become maximum and disposing the N-type diffusion layer resistance element pair along the <100> orientation direction in which the stress sensitivities becomes maximum. In this case, $\Delta R/R_{p-p}$ is 0.8% to 0.9% and the stress application angle dependence occurs.

In FIG. 5, reference character 501 denotes the resistance change rate ΔR/R in a case of disposing the P-type diffusion layer resistance element pair along the <100> orientation direction in which the stress sensitivities become minimum and disposing the N-type diffusion layer resistance element pair along the <100> orientation direction in which the stress sensitivities become maximum. In this case, similarly to the case of the reference character 500, $\Delta R/R_{p-p}$ is 0.8% to 0.9% and the stress application angle dependence occurs.

On the other hand, in FIG. 5, reference character 502 denotes the resistance change rate ΔR/R in a case of disposing the P-type diffusion layer resistance element pair along the <100> orientation direction in which the stress sensitivities become minimum and disposing the N-type diffusion layer resistance element pair along the <110> orientation direction in which the stress sensitivities become minimum as depicted in FIG. 1. In this case, $\Delta R/R_{p-p}$ is as small as 0.05%.

In this way, (1) combining the resistance elements forming the right angle with respect to each other and the same in shape and type makes it possible to reduce the stress application angle dependence of the resistance value. (2) Furthermore, combining the P-type diffusion layer resistance element pair forming the right angle with respect to each other and connected in series and the N-type diffusion layer resistance element pair forming the right angle with respect to each other and connected in series makes it possible to reduce the stress application angle dependence of the resistance value. (3) Moreover, disposing the P-type diffusion layer resistance elements and the N-type diffusion layer resistance elements each along the predetermined crystal axis direction in which the piezoresistance coefficients become low makes it possible to reduce the stress application angle dependence of the resistance value that occurs due to variations in resistance value. As a result, it is possible to provide the resistance circuit capable of reducing stress-induced characteristic fluctuations.

Modifications of First Embodiment

Figure 6A:
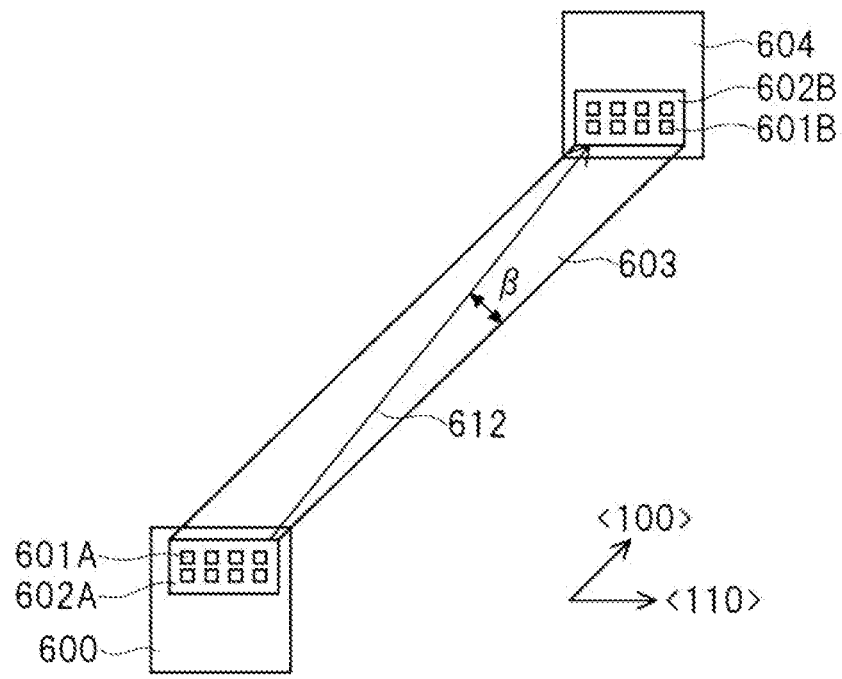
FIG. 6A is a plan view depicting a P-type diffusion layer resistance elements serving as a basic P-type diffusion layer resistance element according to the first embodiment.
Figure 6B:
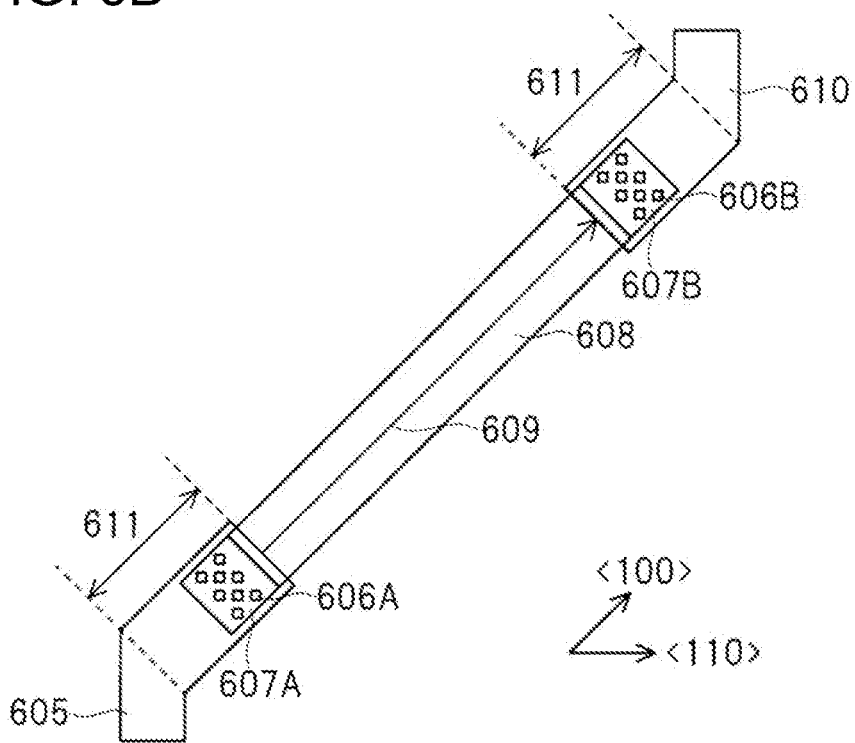
FIG. 6B is a plan view depicting a P-type diffusion layer resistance element according to a first modification of the first embodiment.
Figure 7:
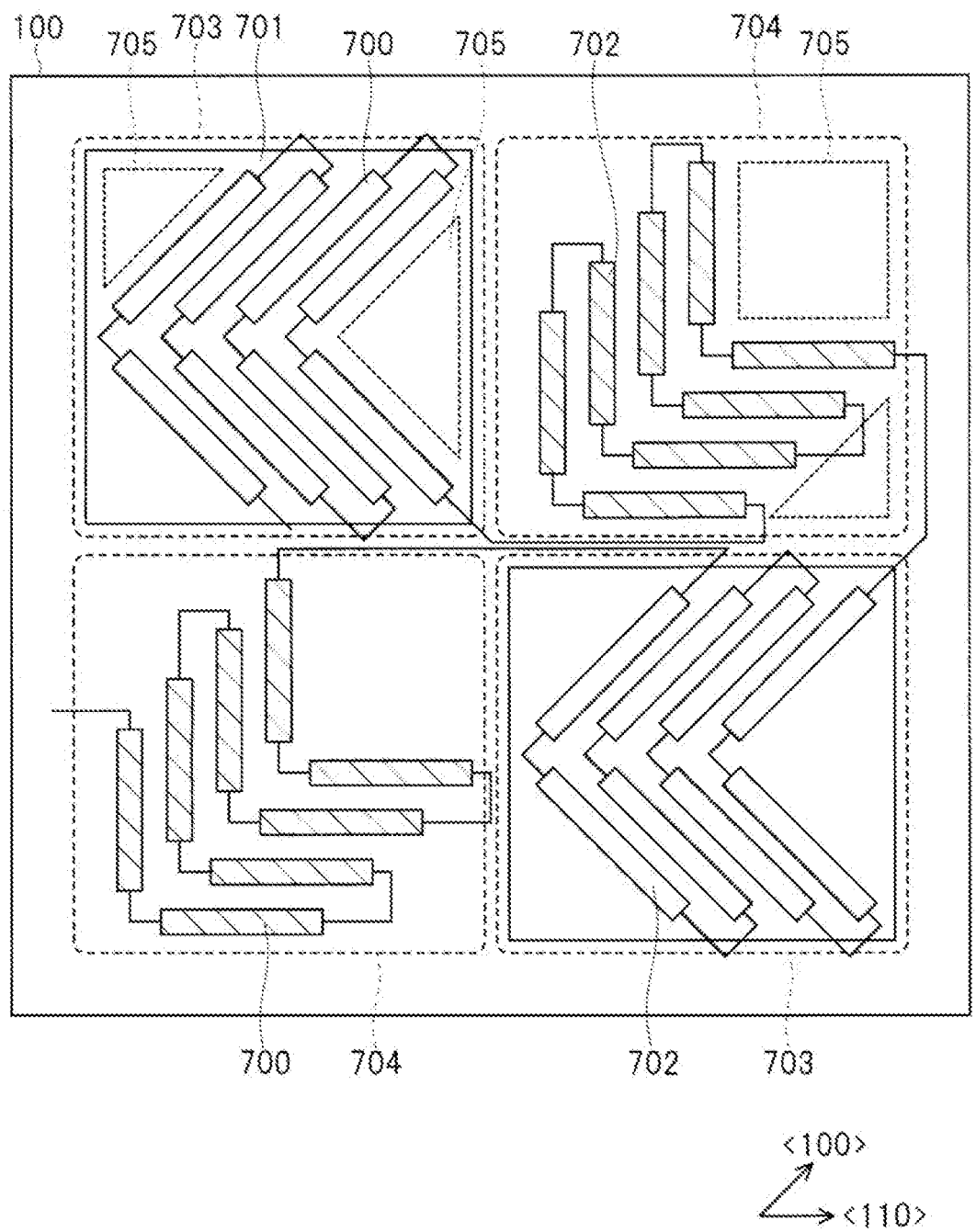
FIG. 7 is a plan view depicting disposition of P-type diffusion layer resistance elements and N-type diffusion layer resistance elements that configure a resistance circuit according to a second modification of the first embodiment.
Figure 8:
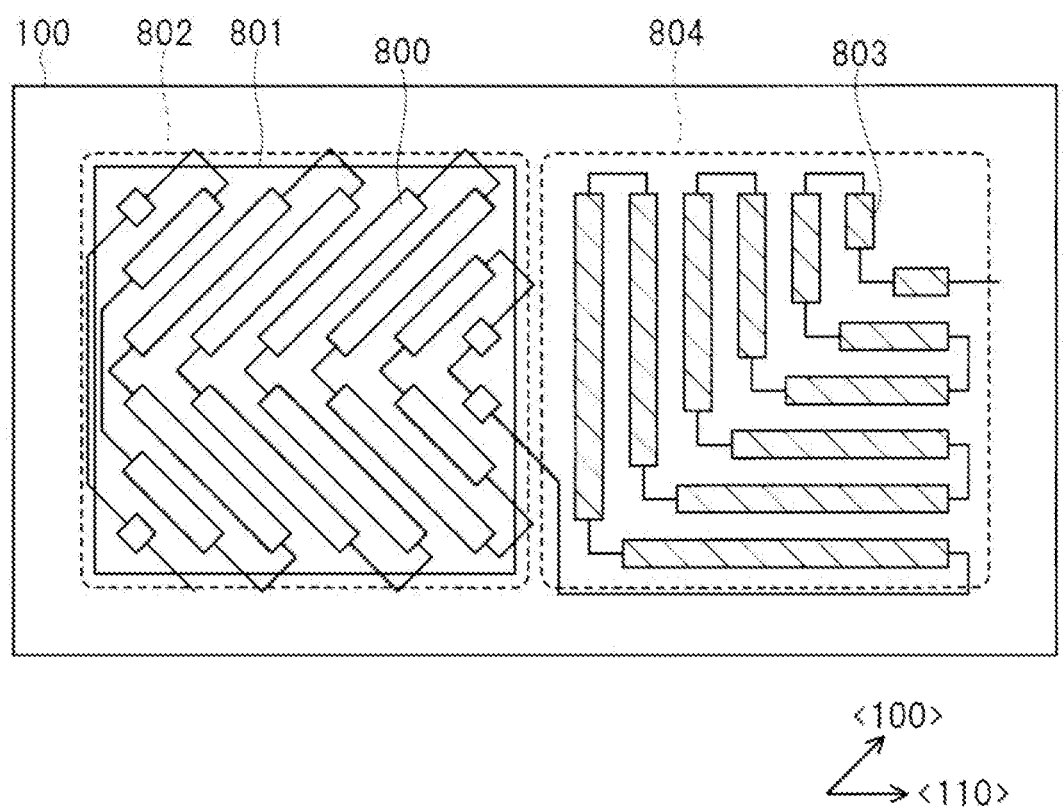
FIG. 8 is a plan view depicting disposition of P-type diffusion layer resistance elements and N-type diffusion layer resistance elements that configure a resistance circuit according to a third modification of the first embodiment.
Figure 9A:
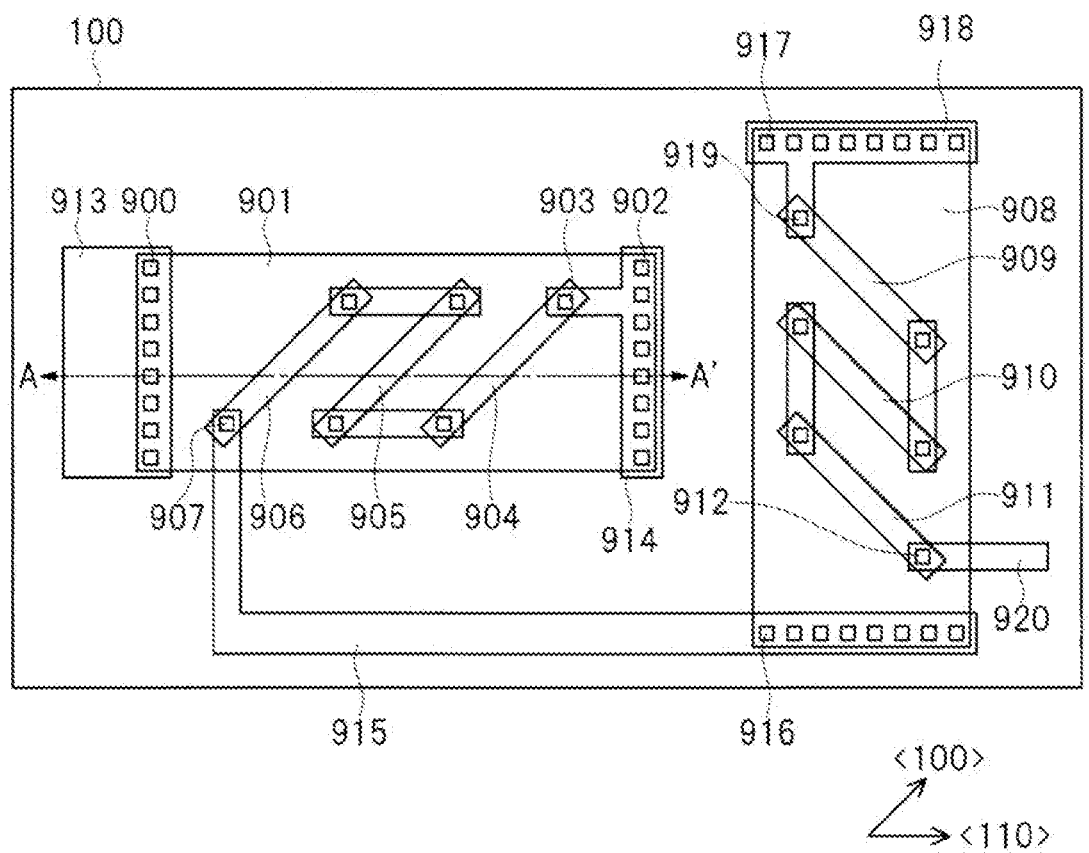
FIG. 9A is a plan view depicting disposition of P-type diffusion layer resistance elements and N-type diffusion layer resistance elements that configure a resistance circuit according to a fourth modification of the first embodiment.
Figure 9B:
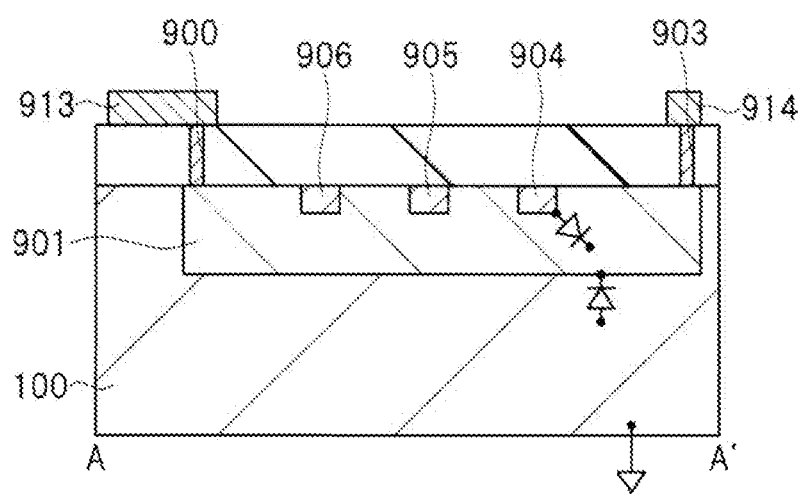
FIG. 9B is a cross-sectional view taken along line A-A' of FIG. 9A.
Figure 10A:
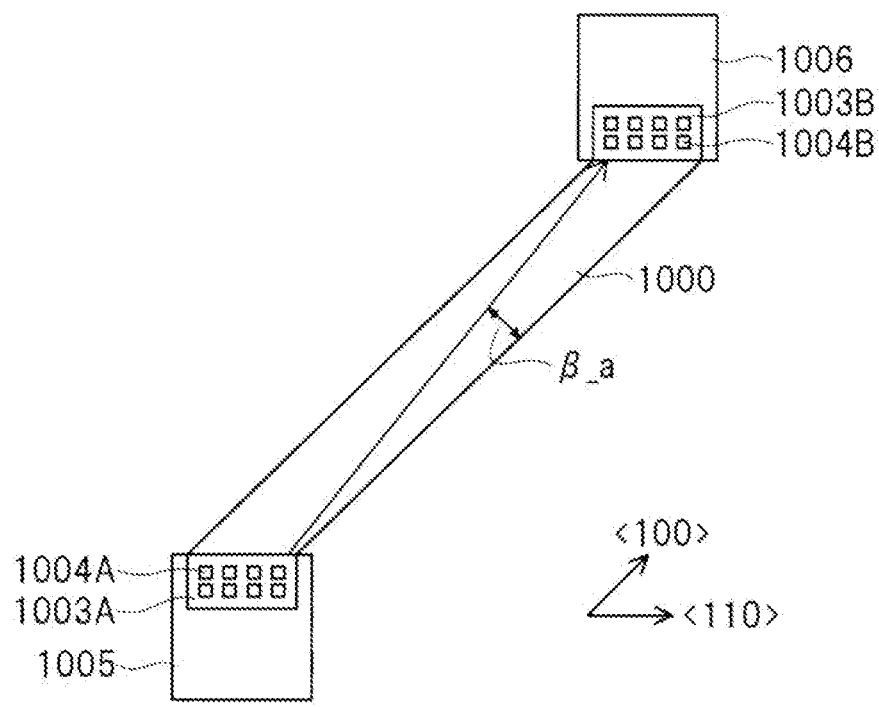
FIG. 10A is a plan view depicting a P-type diffusion layer resistance element serving as a basic P-type diffusion layer resistance element according to the first embodiment.
Figure 10B:
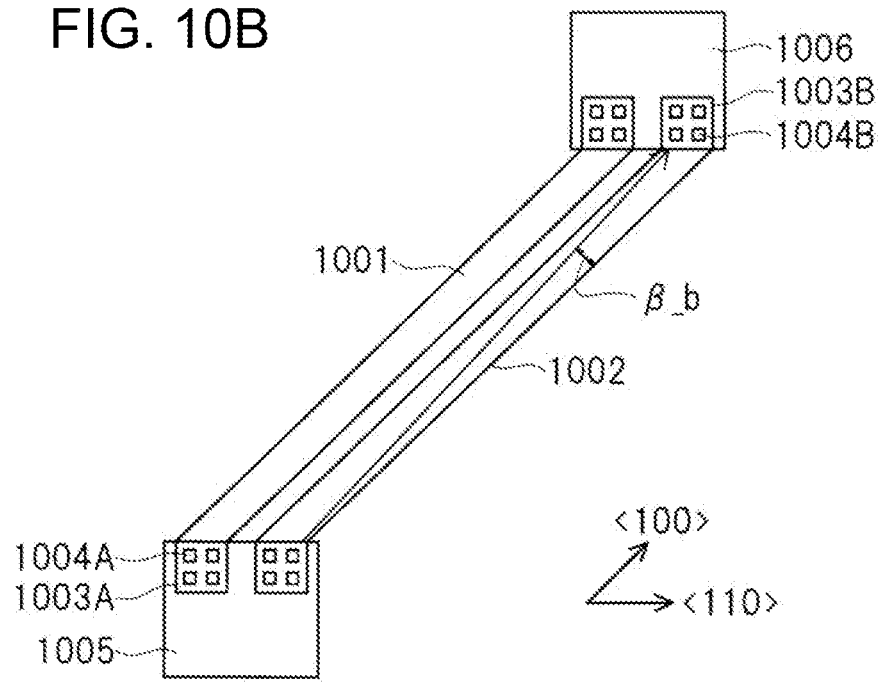
FIG. 10B is a plan view depicting a P-type diffusion layer resistance element according to a fifth modification of the first embodiment.
Figure 11:
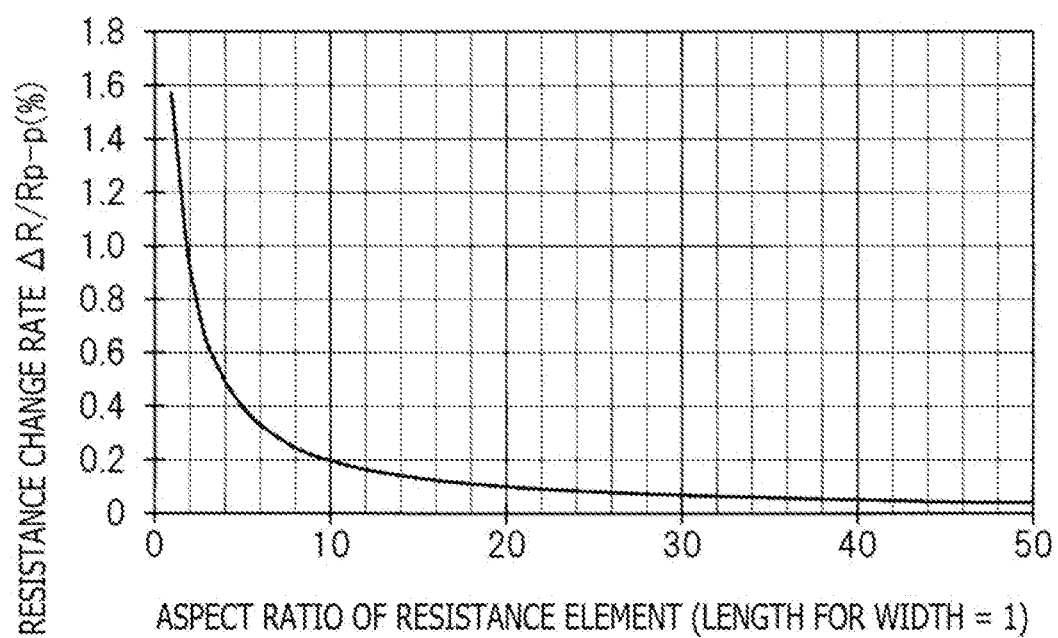
FIG. 11 is a graph chart depicting a relationship between a resistance change rate and an aspect ratio of a resistance element at a time of applying a stress to the resistance element.

Resistance elements and resistance circuits according to modifications of the first embodiment will be described with reference to FIGS. 6A to 11. FIG. 6A is a plan view depicting a P-type diffusion layer resistance element serving as a basic P-type diffusion layer resistance element according to the first embodiment. FIG. 6B is a plan view depicting a P-type diffusion layer resistance element according to a first modification of the first embodiment. FIG. 7 is a plan view depicting disposition of P-type diffusion layer resistance elements and N-type diffusion layer resistance elements that configure a resistance circuit according to a second modification of the first embodiment. FIG. 8 is a plan view depicting disposition of P-type diffusion layer resistance elements and N-type diffusion layer resistance elements that configure a resistance circuit according to a third modification of the first embodiment. FIG. 9A is a plan view depicting disposition of P-type diffusion layer resistance elements and N-type diffusion layer resistance elements that configure a resistance circuit according to a fourth modification of the first embodiment. FIG. 9B is a cross-sectional view taken along line A-A' of FIG. 9A. FIG. 10A is a plan view depicting a P-type diffusion layer resistance element serving as a basic P-type diffusion layer resistance element according to the first embodiment. FIG. 10B is a plan view depicting a P-type diffusion layer resistance element according to a fifth modification of the first embodiment. FIG. 11 is a graph chart depicting a relationship between the resistance change rate $\Delta R/R_{p-p}$ at the time of applying a stress to a resistance element and an aspect ratio (length/width) of the resistance element.

1. First Modification

FIG. 6A depicts the P-type diffusion layer resistance element serving as the basic P-type diffusion layer resistance element according to the first embodiment, and FIG. 6B depicts a P-type diffusion layer resistance element according to the first modification of the first embodiment.

As depicted in FIG. 6A, a P-type diffusion layer resistance element 603 is disposed along the <100> orientation direction. Furthermore, a diffusion layer 602A is formed in one end portion of the P-type diffusion layer resistance element 603, and the diffusion layer 602A is electrically connected to a metal interconnection layer 600 via contacts 601A. Moreover, a diffusion layer 602B is formed in the other end portion of the P-type diffusion layer resistance element 603, and the diffusion layer 602B is electrically connected to a metal interconnection layer 604 via contacts 601B. Since the diffusion layer 602A is connected to the contacts 601A at a low resistance and the diffusion layer 602B is connected to the contacts 601B at a low resistance, the diffusion layers 602A and 602B are silicided.

Furthermore, the diffusion layer 602A is formed in such a manner that out of sides of the silicided diffusion layer (silicide region) 602A formed in one end portion of the P-type diffusion layer resistance element 603, the side thereof opposed to the diffusion layer 602B formed in the other end portion of the P-type diffusion layer resistance element 603 is along the <110> orientation direction. Likewise, the diffusion layer 602B is formed in such a manner that out of sides of the silicided diffusion layer (silicide region) 602B formed in the other end portion of the P-type diffusion layer resistance element 603, the side thereof opposed to the diffusion layer 602A formed in the one end portion of the P-type diffusion layer resistance element 603 is along the <110> orientation direction. In other words, the sides of the diffusion layers 602A and 602B facing each other across the P-type diffusion layer resistance element 603 are disposed in parallel along the <110> orientation direction in the two silicided diffusion layers 602A and 602B provided in the two end portions of the P-type diffusion layer resistance element 603, respectively.

When a current is fed through the P-type diffusion layer resistance element 603, the current follows a current path 612 at a shortest distance between one diffusion layer 602A and the other diffusion layer 602B. This is because the current has a property of concentrating on a path at the lowest resistance; thus, with the diffusion layers 602A and 603B disposed as depicted in FIG. 6A, the current concentrates on the current path 612 that is the shortest path among straight lines connecting the diffusion layer 602A that is one silicided region to the diffusion layer 602B that is the other silicided region.

With the diffusion layers 602A and 602B disposed in this way, even if the P-type diffusion layer resistance element 603 is disposed along the <100> orientation direction, the current path 612 on which the current is fed is in a direction deviated from the <100> orientation direction by an angle β. Since the Piezoresistance effect acts on the path on which the current is fed, the diffusion layers 602A and 602B disposed as depicted in FIG. 6A possibly cause the occurrence of stress dependence resulting from a deviation in the direction in which the current is fed through.

The first modification depicted in FIG. 6B is intended to address the problem described above. In the first modification, a P-type diffusion layer resistance element 608 is disposed along the <100> orientation direction. Furthermore, a diffusion layer 607A is formed in one end portion of the P-type diffusion layer resistance element 608, and the diffusion layer 607A is electrically connected to a metal interconnection layer 605 via contacts 606A. Moreover, a diffusion layer 607B is formed in the other end portion of the P-type diffusion layer resistance element 608, and the diffusion layer 607B is electrically connected to a metal interconnection layer 610 via contacts 606B. Since the diffusion layer 607A is connected to the contacts 606A at a low resistance and the diffusion layer 607B is connected to the contacts 606B at a low resistance, the diffusion layers 607A and 607B are silicided.

Out of sides of the silicided diffusion layer (silicide region) 607A formed in the one end portion of the P-type diffusion layer resistance element 608, the side thereof opposed to the diffusion layer 607B formed in the other end portion of the P-type diffusion layer resistance element 608 is orthogonal to the direction (<100> orientation direction) in which the P-type diffusion layer resistance element 608 extends. Likewise, out of sides of the silicided diffusion layer (silicide region) 607B formed in the other end portion of the P-type diffusion layer resistance element 608, the side thereof opposed to the diffusion layer 607A formed in the one end portion of the P-type diffusion layer resistance element 608 is orthogonal to the direction (<100> orientation direction) in which the P-type diffusion layer resistance element 608 extends. In other words, the sides of the diffusion layers 607A and 607B facing each other across the P-type diffusion layer resistance element 608 are disposed in parallel along the <100> orientation direction in the two silicided diffusion layers 607A and 607B provided in the two end portions of the P-type diffusion layer resistance element 608, respectively.

Moreover, the plurality of contacts 606A are disposed apart from one another in parallel to the side of the diffusion layer 607A opposed to the diffusion layer 607B. Likewise, the plurality of contacts 606B are disposed apart from one another in parallel to the side of the diffusion layer 607B opposed to the diffusion layer 607A.

By disposing the diffusion layers 607A and 607B in this way, a shortest current path is along the <100> orientation direction as denoted as a current path 609 among straight lines connecting one diffusion layer 607A to the other diffusion layer 607B.

To feed the current in the <100> orientation direction more strictly, it is preferable to provide regions 611 in a portion that is an end portion of the metal interconnection layer 605 and that is connected to the contacts 606A and in a portion that is an end portion of the metal interconnection layer 610 and that is connected to the contacts 606B in such a manner that the regions 611 extend in the same direction as the direction (<100> orientation direction) in which the P-type diffusion layer resistance element 608 extends with similar shapes to those of the diffusion layers 607A and 607B.

Disposing the diffusion layers 607A and 607B and the contacts 606A and 606B in this way makes the direction in which the current is fed through in the P-type diffusion layer resistance element 608 close to the <100> orientation direction; thus, it is possible to realize the resistance element with less stress dependence.

2. Second Modification

FIG. 7 depicts disposition of P-type diffusion layer resistance elements and N-type diffusion layer resistance elements that configure a resistance circuit according to the second modification of the first embodiment.

As depicted in FIG. 7, the resistance circuit according to the second embodiment has regions 703 where a plurality of P-type diffusion layer resistance element 700 pairs are disposed along the <110> orientation direction, and regions 704 where a plurality of N-type diffusion layer resistance element 702 pairs are disposed along the <100> orientation direction. The P-type diffusion layer resistance element 700 pair is a set of two P-type diffusion layer resistance elements 700 forming the right angle with respect to each other and disposed along the <100> orientation direction, while the N-type diffusion layer resistance element 702 pair is a set of two N-type diffusion layer resistance elements 702 forming the right angle with respect to each other and disposed along the <110> orientation direction. A plurality of P-type diffusion layer resistance elements 700 are formed within an N-type well 701. Furthermore, the regions 703 and 704 are alternately disposed in the <110> orientation direction and alternately disposed in a direction orthogonal to the <110> orientation direction, so that the regions 703 and 704 are disposed checkerwise.

To exercise an effect of resolving the influence of stress on the resistance circuit according to the first embodiment, it is desirable that a value of the stress received by the P-type diffusion layer resistance elements and a value of the stress received by the N-type diffusion layer resistance elements are as close as possible. On the other hand, a stress on a semiconductor chip is not uniform but has a certain distribution; thus, with the P-type diffusion layer resistance elements and the N-type diffusion layer resistance elements disposed apart from one another, the effect of resolving the influence of stress is possibly reduced.

The second modification has been achieved in the light of the problem described above, and making physically short the distance between the P-type diffusion layer resistance elements 700 and the N-type diffusion layer resistance element 702 enables the stress applied to the P-type diffusion layer resistance elements 700 and the stress applied to the N-type diffusion layer resistance elements 702 to be close to each other. According to the second modification, therefore, it is possible to provide the resistance circuit capable of reducing stress-induced characteristic fluctuations.

3. Third Modification

FIG. 8 depicts disposition of P-type diffusion layer resistance elements and N-type diffusion layer resistance elements that configure a resistance circuit according to the third modification of the first embodiment.

As depicted in FIG. 8, the resistance circuit according to the third embodiment has a region 802 where a plurality of P-type diffusion layer resistance element 800 pairs are disposed along the <110> orientation direction, and a region 804 where a plurality of N-type diffusion layer resistance element 803 pairs are disposed along the <100> orientation direction. The P-type diffusion layer resistance element 800 pair is a set of two P-type diffusion layer resistance elements 800 forming the right angle with respect to each other, disposed along the <100> orientation direction, and having the same length, while the N-type diffusion layer resistance element 803 pair is a set of two N-type diffusion layer resistance elements 803 forming the right angle with respect to each other, disposed along the <110> orientation direction, and having the same length. A plurality of P-type diffusion layer resistance elements 800 are formed within an N-type well 801. Furthermore, the P-type diffusion layer resistance element 800 pairs having different lengths are disposed in the region 802, while the N-type diffusion layer resistance element 803 pairs having different lengths are disposed in the region 804.

In the case of the resistance circuit according to the second modification described above, blank regions 705 where the P-type diffusion layer resistance elements 700 are not present are generated in the region 703, and blank regions 705 where the N-type diffusion layer resistance elements 702 are not present are generated in the region 704, so that area efficiency of the resistance circuit deteriorates. Since an increase in a chip area causes a cost increase of a semiconductor chip, it is desirable that the area efficiency of the resistance circuit is high.

To address the problem, in the third modification, the P-type diffusion layer resistance element 800 pair having a small length is disposed in each blank region in the region 802 and the N-type diffusion layer resistance element 803 pair having a small length is disposed in the blank region in the region 804, thereby improving the area efficiency. According to the third modification, therefore, it is possible to provide the resistance circuit not only exercising the effects described in the previous first embodiment but also at a low cost by enhancing the area efficiency of the resistance circuit.

4. Fourth Modification

FIG. 9A depicts disposition of P-type diffusion layer resistance elements and N-type diffusion layer resistance elements that configure a resistance circuit according to the fourth modification of the first embodiment, and FIG. 9B depicts a cross-section taken along line A-A' of FIG. 9A. It is noted that silicided regions are omitted in FIGS. 9A and 9B.

As depicted in FIGS. 9A and 9B, the resistance circuit according to the fourth modification is characterized by using N-type wells 901 and 908 for isolating P-type diffusion layer resistance elements 904, 905, 906, 909, 910, and 911 from the semiconductor substrate 100 as N-type diffusion layer resistance elements.

In the resistance circuit according to the fourth modification, a current is fed through the N-type well 901 from a metal interconnection layer 913 via contacts 900, and then fed through the P-type diffusion layer resistance elements 904, 905, and 906 by way of contacts 902, a metal interconnection layer 914 and contacts 903. Subsequently, the current is fed through the N-type well 908 by way of contacts 907, a metal interconnection layer 915 and contacts 916, then fed through the P-type diffusion layer resistance elements 909, 910, and 911 by way of contacts 917, a metal interconnection layer 918, and contacts 919, and further fed through a metal interconnection layer 920 via a contact 912. In this case, the N-type wells 901 and 908 function as the N-type diffusion layer resistance elements.

According to the fourth modification, it is possible not only to exercise the effects described in the previous first embodiment but also to reduce regions for forming the N-type diffusion layer resistance elements; thus, mounting efficiency of the resistance circuit improves. Furthermore, positions of the P-type diffusion layer resistance elements 904, 905, and 906 can be set close to that of the N-type diffusion layer resistance element (N-type well 901) and positions of the P-type diffusion layer resistance elements 909, 910, and 911 can be set close to that of the N-type diffusion layer resistance element (N-type well 908); thus, the influence of the stress distribution is reduced. As a result, it is possible to provide the resistance circuit that reduces stress-induced characteristic fluctuations at a low cost.

It is noted that in the resistance circuit depicted in FIGS. 9A and 9B, the current preferably is input first to the N-type well 901 and then input to the P-type diffusion layer resistance elements 904, 905, and 906 formed within the N-type well 901. With the above configuration, a voltage drop occurs by the N-type well 901 and potentials of the P-type diffusion layer resistance elements 904, 905, and 906 are, therefore, always lower than that of the N-type well 901. As a result, a parasitic diode present between the P-type diffusion layer resistance elements 904, 905, and 906 and the N-type well 901 is reversely biased, so that it is possible to electrically isolate the P-type diffusion layer resistance elements 904, 905, and 906 from the N-type well 901. As a result, it is possible to realize the resistance value close to the design value as the resistance circuit.

5. Fifth Modification

FIG. 10A depicts a P-type diffusion layer resistance element serving as a basic P-type diffusion layer resistance element according to the first embodiment, and FIG. 10B depicts a P-type diffusion layer resistance element according to the fifth modification of the first embodiment.

A P-type diffusion layer resistance element 1000 serving as the basic P-type diffusion layer resistance element depicted in FIG. 10A is substantially identical to the P-type diffusion layer resistance element 603 depicted in FIG. 6A. In other words, the P-type diffusion layer resistance element 1000 is disposed along the <100> orientation direction. Furthermore, a diffusion layer 1003A is formed in one end portion of the P-type diffusion layer resistance element 1000, and the diffusion layer 1003A is electrically connected to a metal interconnection layer 1005 via contacts 1004A. Moreover, a diffusion layer 1003B is formed in the other end portion of the P-type diffusion layer resistance element 1000, and the diffusion layer 1003B is electrically connected to a metal interconnection layer 1006 via contacts 1004B. Since the diffusion layer 1003A is connected to the contacts 1004A at a low resistance and the diffusion layer 1003B is connected to the contacts 1004B at a low resistance, the diffusion layers 1003A and 1003B are silicided.

The fifth modification depicted in FIG. 10B is characterized by dividing the P-type diffusion layer resistance element 1000 serving as the basic P-type diffusion layer resistance element depicted in FIG. 10A into two P-type diffusion layer resistance elements 1001 and 1002. In other words, lengths of the P-type diffusion layer resistance elements 1001 and 1002 are the same as that of the P-type diffusion layer resistance element 1000, while widths of the P-type diffusion layer resistance elements 1001 and 1002 are approximately half of that of the P-type diffusion layer resistance element 1000. While resistance values of the P-type diffusion layer resistance elements 1001 and 1002 are approximately twice as large as that of the P-type diffusion layer resistance element 1000, connecting the P-type diffusion layer resistance elements 1001 and 1002 in parallel by the metal interconnection layers 1005 and 1006 enables the resistance values of the P-type diffusion layer resistance elements 1001 and 1002 to be substantially, equivalently equal to that of the P-type diffusion layer resistance element 1000.

According to the fifth modification, an angle $\beta\_a$ of a current shortest path with respect to the <100> orientation direction in the P-type diffusion layer resistance element 1000 is reduced to an angle $\beta\_b$ of a current shortest path with respect to the <100> orientation direction in the P-type diffusion layer resistance elements 1001 and 1002; thus, a current is fed in a direction closer to the <100> orientation direction. In other words, as the width is smaller for the same length, that is, as an aspect ratio (length for a width=1) of the resistance element is higher, a deviation in a current direction with respect to the <100> orientation direction is reduced.

FIG. 11 depicts a relationship between the resistance change rate $\Delta R/R_{p-p}$ and the aspect ratio (length/width) of the resistance element in a case of taking into account the influence of the deviation in the current direction (resistance change rate ($\Delta R/R$) of the two P-type diffusion layer resistance elements denoted by reference character 402 in FIG. 4, forming the right angle with respect to each other, and connected in series).

As depicted in FIG. 11, as the aspect ratio of the resistance element is lower, the deviation in the current direction from the <100> orientation direction becomes greater and the resistance change rate $\Delta R/R_{p-p}$, therefore, rises.

However, according to the fifth modification, the direction in which the current is fed is closer to the <100> orientation direction by dividing the P-type diffusion layer resistance element 1000 into a plurality of P-type diffusion layer resistance elements (for example, the two P-type diffusion layer resistance elements 1001 and 1002); thus, it is possible to provide the resistance circuit that reduces stress-induced characteristic fluctuations.

Second Embodiment

Figure 12:
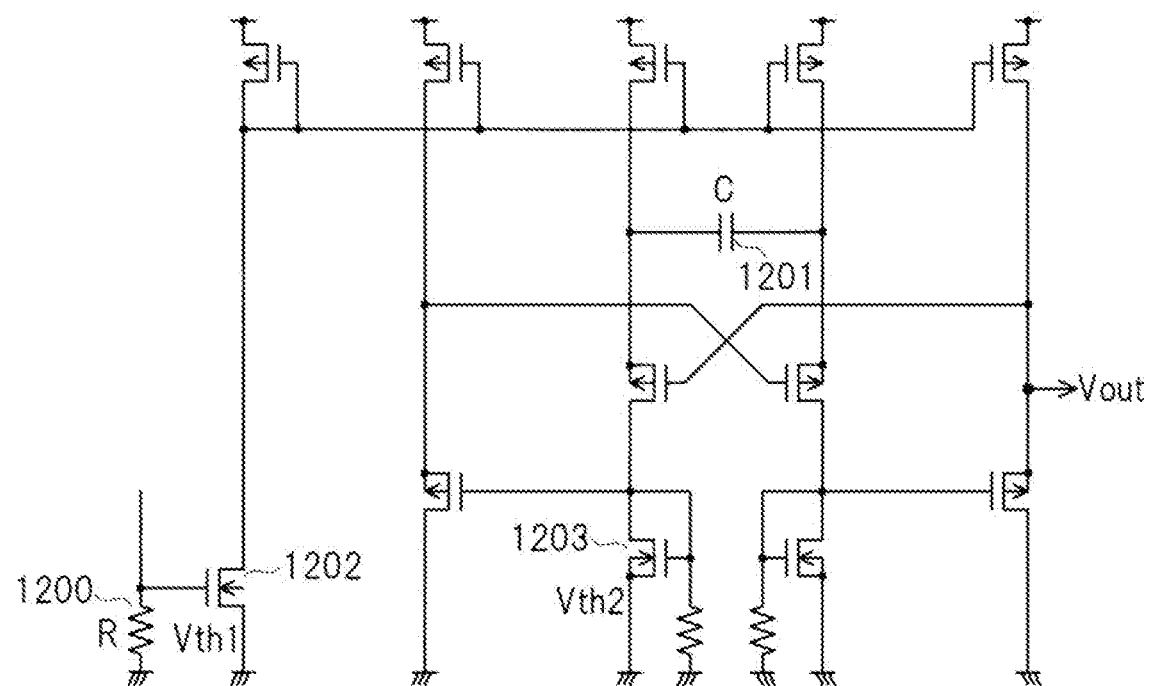
FIG. 12 is a circuit diagram of an oscillation circuit according to a second embodiment.
Figure 13:
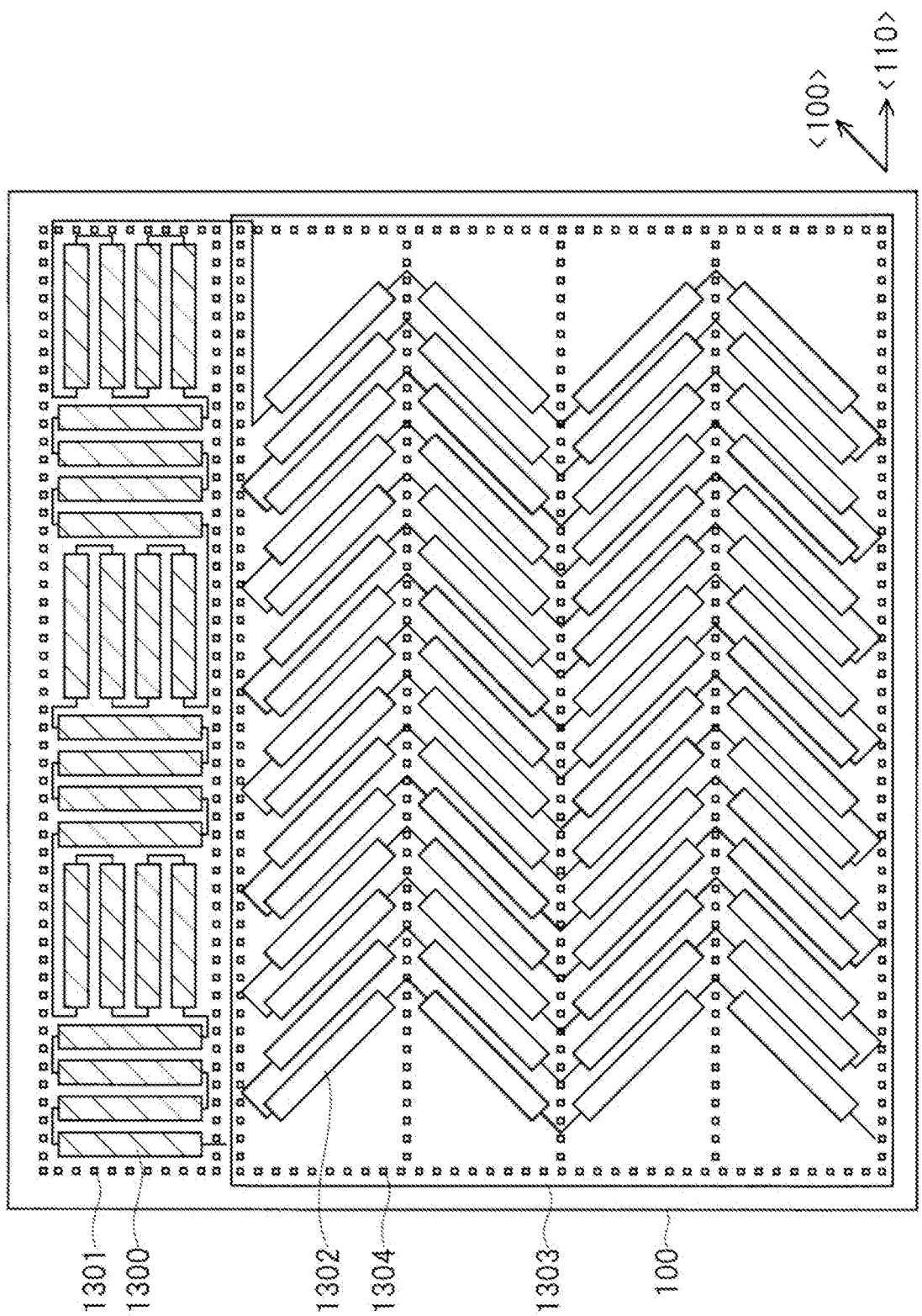
FIG. 13 is a plan view depicting disposition of P-type diffusion layer resistance elements and N-type diffusion layer resistance elements that configure a resistance circuit according to the second embodiment.

An oscillation circuit according to a second embodiment will be described with reference to FIGS. 12 and 13. FIG. 12 is a circuit diagram of the oscillation circuit according to the second embodiment. FIG. 13 is a plan view depicting disposition of P-type diffusion layer resistance elements and N-type diffusion layer resistance elements that configure a resistance circuit according to the second embodiment.

The oscillation circuit according to the second embodiment includes a resistance circuit 1200, a capacitor 1201, and MOS (Metal Oxide Semiconductor) transistors 1202 and 1203. The resistance circuit 1200 is, for example, the resistance circuit described in the first embodiment.

An oscillating frequency of an output Vout from the oscillation circuit depicted in FIG. 12 is represented by Equation (25).

[Equation 25]

$$f(V_{out}) = \frac{V_{th1}}{R} \frac{1}{CV_{th2}} \qquad (25)$$

In Equation 25, R denotes a resistance value of the resistance circuit 1200, C denotes a capacitance value of the capacitor 1201, $V_{th1}$ denotes a threshold of the MOS transistor 1202, and $V_{th2}$ denotes a threshold of the MOS transistor 1203.

As depicted in Equation (25), when the resistance value R of the resistance circuit 1200 fluctuates by stress at a time of mounting, the oscillating frequency also fluctuates. For example, in a sensor apparatus that converts an output value from a sensor into a frequency and that outputs the frequency or an apparatus that measures time with reference to a frequency of an oscillator, a fluctuation in the oscillating frequency of the oscillator that forms the basis of a signal is regarded as an error in the apparatus. It is, therefore, desirable that the oscillating frequency of the oscillator is stable. For example, adjusting the resistance value of the oscillator by trimming or the like after assembly of a package makes it possible to reduce the influence of the stress at the time of mounting a semiconductor chip including the oscillator into the package. In this case, however, it is impossible to correct a fluctuation in the resistance value R of the resistance circuit 1200 that occur due to a change in stress accompanying deterioration of the package caused by a change in an environmental temperature during usage and long-term use.

Nevertheless, according to the second embodiment, reducing the stress dependence of the resistance circuit 1200 itself that is an element determining the oscillating frequency of the oscillator enables the resistance value R of the resistance circuit 1200 to be kept substantially constant for a stress having an arbitrary magnitude in an arbitrary direction; thus, it is possible to provide the oscillator that outputs a stable oscillating frequency.

FIG. 13 depicts an example of disposition of P-type diffusion layer resistance elements 1302 and N-type diffusion layer resistance elements 1300 that configure the resistance circuit 1200. Similarly to the first embodiment described above, the P-type diffusion layer resistance elements 1302 are disposed along the <100> orientation direction and the N-type diffusion layer resistance elements 1300 are disposed along the <110> orientation direction. Furthermore, a plurality of sets (P-type diffusion layer resistance element 1302 pairs) each of which forms the right angle with respect to each other and which is two P-type diffusion layer resistance elements are disposed, and a plurality of sets (N-type diffusion layer resistance element 1300 pairs) each of which forms the right angle with respect to each other and which is two N-type diffusion layer resistance elements 1300 are disposed. A plurality of P-type diffusion layer resistance elements 1302 are disposed within an N-type well 1303.

A region where a plurality of N-type diffusion layer resistance elements 1300 are disposed is surrounded by substrate contacts 1301, and a potential of the semiconductor substrate 100 is fixed via the substrate contacts 1301. Furthermore, in the N-type well 1303, a region where the plurality of P-type diffusion layer resistance elements 1302 are disposed is surrounded by well contacts 1304, and a potential of the N-type well 1303 is fixed via the well contacts 1304.

According to the second embodiment, the potential of the semiconductor substrate 100 and that of the N-type well 1303 are stabilized; thus, it is possible to provide the oscillator that can output a stable oscillating frequency with less stress dependence and that is less susceptible to the influence of noise.

Third Embodiment

Figure 14:
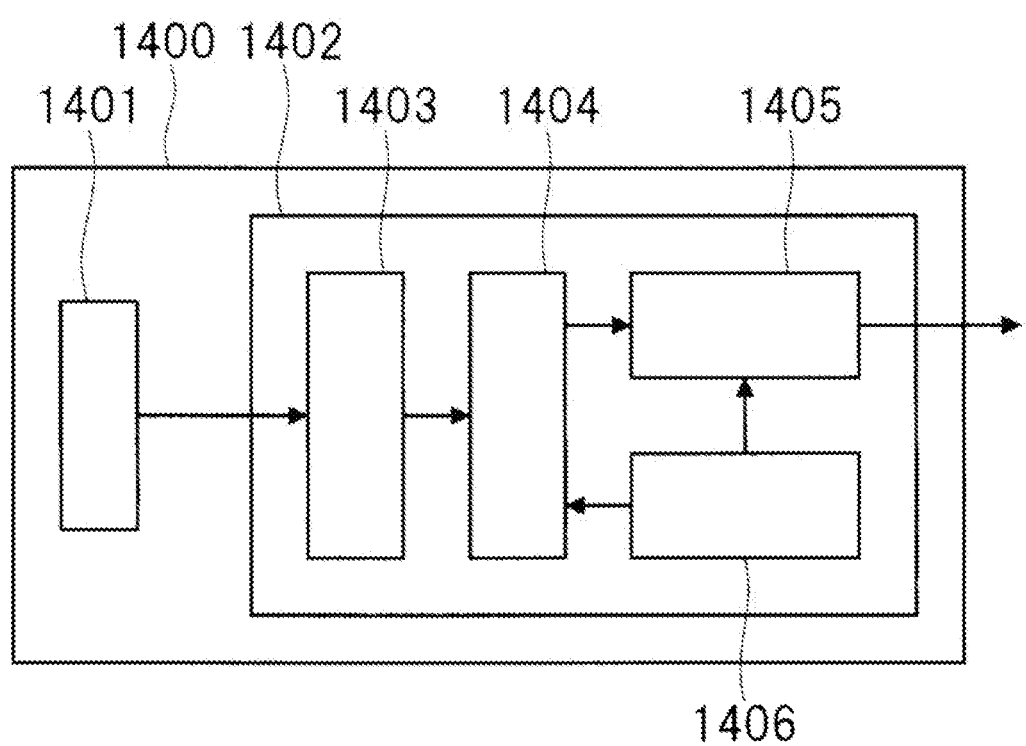
FIG. 14 is a block diagram of an in-vehicle air flow rate measurement apparatus according to a third embodiment.
Figure 15:
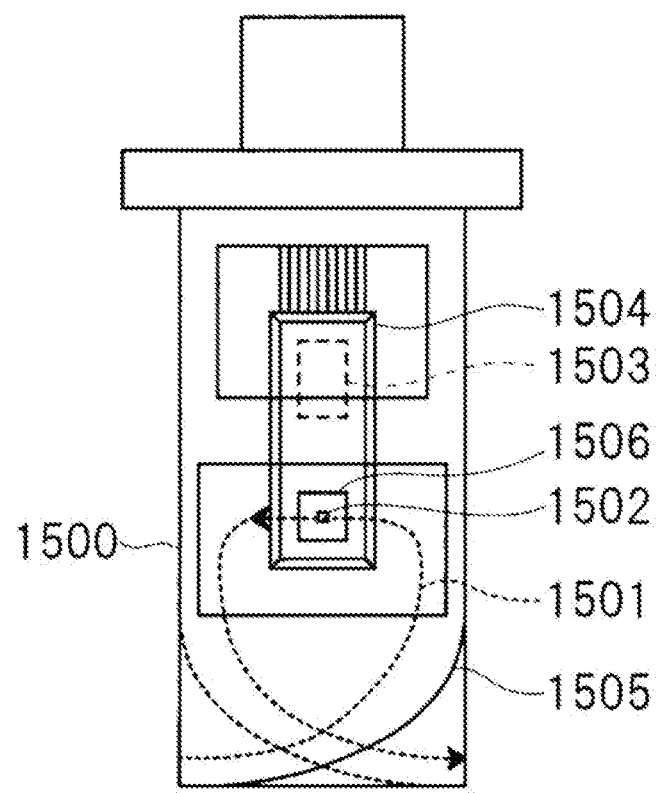
FIG. 15 is a configuration diagram of the in-vehicle air flow rate measurement apparatus according to the third embodiment.

An in-vehicle air flow rate measurement apparatus according to a third embodiment will be described with reference to FIGS. 14 and 15. FIG. 14 is a block diagram of the in-vehicle air flow rate measurement apparatus according to the third embodiment. FIG. 15 is a configuration diagram of the in-vehicle air flow rate measurement apparatus according to the third embodiment.

As depicted in FIG. 14, an air flow rate measurement apparatus 1400 according to the third embodiment includes a sensor element 1401 and a semiconductor chip 1402. Furthermore, the semiconductor chip 1402 is characterized by including an AD converter 1403, a signal processing section 1404, an output circuit 1405, and an oscillation circuit 1406 described in the second embodiment.

The sensor element 1401 is a resistance bridge type temperature sensor that includes a heater for heating air to be measured and that measures a temperature distribution of the air, and outputs an electrical signal in response to an air flow rate. The output electrical signal is converted into a digital signal by the AD converter 1403 and subjected to a computing process such as correction by the signal processing section 1404. Corrected air flow rate data is converted into a frequency modulating signal by the output circuit 1405 and the frequency modulating signal is output. The oscillation circuit 1406 drives the signal processing section 1404 and supplies a reference frequency for the output circuit to generate the frequency modulating signal. It is noted that associated blocks such as a power supply circuit, a protection circuit, and a heater control circuit are omitted in the air flow rate measurement apparatus 1400 depicted in FIG. 14.

As depicted in FIG. 15, a sensor element 1502 and a semiconductor chip 1503 are integrated with each other and encapsulated in the same chip package 1504. The chip package 1504 is further encapsulated in a housing 1500. Moreover, the chip package 1504 has a structure in which an opening portion 1506 is formed and the sensor element 1502 is exposed from the opening portion 1506. A flow passage 1505 is formed in the housing 1500, the air to be measured reaches the sensor element 1502 through a path 1501, so that the air flow rate can be measured.

The semiconductor chip 1503 including the oscillation circuit 1406 is subjected to two mounting processes that are a process of encapsulation into the chip package 1504 and then a process of encapsulation into the housing 1500. As a result, the oscillating frequency of the oscillation circuit 1406 possibly changes by receiving a stress at the time of mounting. When the oscillating frequency of the oscillation circuit 1406 changes, an output flow rate signal also changes; thus, accuracy of the air flow rate measurement apparatus 1400 disadvantageously deteriorates. Moreover, the in-vehicle air flow rate measurement apparatus 1400 is used in an environment such as an engine room where a temperature or a humidity greatly change; thus, the in-vehicle air flow rate measurement apparatus 1400 has a problem with a large stress fluctuation during usage, compared with a consumer sensor used on a relatively stable condition.

Nevertheless, according to the third embodiment, the stress dependence of the oscillating frequency of the oscillator can be reduced; thus, it is possible to provide the air flow rate measurement apparatus 1400 capable of stably measuring the air flow rate.

While the present invention has been specifically described on the basis of the embodiments, it is needless to say that the present invention is not limited to the embodiments described above and various changes and modifications can be made within the scope of the purport of the invention. For example, the above-mentioned embodiments have been described in detail for describing the present invention so that the present invention is easy to understand, and the present invention is not always limited to those having all the configurations described so far. Furthermore, the configuration of a certain embodiment can be partially replaced by the configuration of the other embodiment or the configuration of the other embodiment can be added to the configuration of the certain embodiment. Moreover, for a part of the configuration of each embodiment, additions, omissions, and substitutions of the other configurations can be made.

DESCRIPTION OF REFERENCE CHARACTERS

100: Semiconductor substrate
101, 102: P-type diffusion layer resistance element
103, 104: N-type diffusion layer resistance element
105: N-type well
400, 401, 402, 403: Resistance change rate
500, 501, 502: Resistance change rate
600: Metal interconnection layer
601A, 601B: Contact
602A, 602B: Diffusion layer
603: P-type diffusion layer resistance element
604: Metal interconnection layer
605: Metal interconnection layer
606A, 606B: Contact
607A, 607B: Diffusion layer
608: P-type diffusion layer resistance element
609: Current path
610: Metal interconnection layer
611: Region
612: Current path
700: P-type diffusion layer resistance element
701: N-type well
702: N-type diffusion layer resistance element
703, 704: Region
705: Blank region
800: P-type diffusion layer resistance element
801: N-type well
802: Region
803: N-type diffusion layer resistance element
804: Region
900: Contact
901: N-type well
902, 903: Contact
904, 905, 905: P-type diffusion layer resistance element
907: Contact
908: N-type well
909, 910, 911: P-type diffusion layer resistance element
912: Contact
913, 914, 915: Metal interconnection layer
916, 917: Contact
918: Metal interconnection layer
919: Contact
920: Metal interconnection layer
1000, 1001, 1002: P-type diffusion layer resistance element
1003A, 1003B: Diffusion layer
1004A, 1004B: Contact
1005, 1006: Metal interconnection layer
1200: Resistance circuit
1201: Capacitor
1202, 1203: MOS transistor
1300: N-type diffusion layer resistance element
1301: Substrate contact
1302: P-type diffusion layer resistance element
1303: N-type well
1304: Well contact
1400: Air flow rate measurement apparatus
1401: Sensor element
1402: Semiconductor chip
1403: AD converter
1404: Signal processing section
1405: Output circuit
1406: Oscillation circuit
1500: Housing
1501: Path
1502: Sensor element
1503: Semiconductor chip
1504: Chip package
1505: Flow passage
1506: Opening portion

The invention claimed is:

1. A resistance circuit comprising:
a semiconductor substrate;
an N-type resistance section that is formed on a principal surface of the semiconductor substrate; and
a P-type resistance section that is formed on the principal surface of the semiconductor substrate and that is electrically connected in series to the N-type resistance section, wherein
the N-type resistance section has a first N-type diffusion layer resistance element and a second N-type diffusion layer resistance element that are disposed to form a right angle with respect to each other and that are electrically connected in series,
the P-type resistance section has a first P-type diffusion layer resistance element and a second P-type diffusion layer resistance element that are disposed to form the right angle with respect to each other and that are electrically connected in series, the first N-type diffusion layer resistance element is disposed along a second crystal orientation direction of the semiconductor substrate, the second crystal orientation direction being different from a first crystal orientation direction of the semiconductor substrate, the first crystal orientation direction being a direction in which a stress sensitivity based on a piezoresistance coefficient becomes maximum, and the first P-type diffusion layer resistance element is disposed along a direction different from the second crystal orientation direction.

2. The resistance circuit according to claim 1, wherein resistance values of the first P-type diffusion layer resistance element and the second P-type diffusion layer resistance element are larger than a resistance value of any of the first N-type diffusion layer resistance element and the second N-type diffusion layer resistance element.

3. The resistance circuit according to claim 1, wherein the second crystal orientation direction is a <110> orientation direction.

4. The resistance circuit according to claim 1, wherein the first P-type diffusion layer resistance element is disposed along an orientation direction at an angle of 45 degrees with respect to the second crystal orientation direction.

5. The resistance circuit according to claim 1, wherein the first P-type diffusion layer resistance element is formed from a semiconductor region where a P-type impurity is introduced into the semiconductor substrate, a first metal interconnection layer is electrically connected to one end portion of the semiconductor region via a first silicide region, a second metal interconnection layer is electrically connected to another end portion of the semiconductor region via a second silicide region, one side of the first silicide region, the one side being opposed to the second silicide region, is provided along a direction orthogonal to a direction in which the first P-type diffusion layer resistance element extends, and one side of the second silicide region, the one side being opposed to the first silicide region, is provided along the direction orthogonal to the direction in which the first P-type diffusion layer resistance element extends.

6. The resistance circuit according to claim 5, wherein a first insulating film is formed between the first silicide region and the first metal interconnection layer, a second insulating film is formed between the second silicide region and the second metal interconnection layer, a plurality of first contacts electrically connecting the first silicide region to the first metal interconnection layer are formed in the first insulating film in parallel to the one side of the first silicide region, the one side being opposed to the second silicide region, and a plurality of second contacts electrically connecting the second silicide region to the second metal interconnection layer are formed in the second insulating film in parallel to the one side of the second silicide region, the one side being opposed to the first silicide region.

7. The resistance circuit according to claim 1, wherein the N-type resistance section and the P-type resistance section are alternately disposed in the second crystal orientation direction and alternately disposed in a direction orthogonal to the second crystal orientation direction.

8. The resistance circuit according to claim 1, wherein the N-type resistance section further has a third N-type diffusion layer resistance element and a fourth N-type diffusion layer resistance element that are disposed to form the right angle with respect to each other and that are electrically connected in series, the P-type resistance section further has a third P-type diffusion layer resistance element and a fourth P-type diffusion layer resistance element that are disposed to form the right angle with respect to each other and that are electrically connected in series, lengths of the third N-type diffusion layer resistance element and the fourth N-type diffusion layer resistance element in an extension direction are smaller than a length of any of the first N-type diffusion layer resistance element and the second N-type diffusion layer resistance element in the extension direction, and lengths of the third P-type diffusion layer resistance element and the fourth P-type diffusion layer resistance element in an extension direction are smaller than a length of any of the first P-type diffusion layer resistance element and the second P-type diffusion layer resistance element in the extension direction.

9. The resistance circuit according to claim 1, including:
a first N-type region that is formed on the principal surface of the semiconductor substrate; and
a second N-type region that is formed on the principal surface of the semiconductor substrate to be apart from the first N-type region, wherein the first P-type diffusion layer resistance element is formed within the first N-type region, the second P-type diffusion layer resistance element is formed within the second N-type region, the first N-type region functions as the first N-type diffusion layer resistance element, and the second N-type region functions as the second N-type diffusion layer resistance element.

10. The resistance circuit according to claim 1, wherein the first P-type diffusion layer resistance element is configured with a first part and a second part provided to be apart from each other in the second crystal orientation direction, the first part and the second part are disposed in a direction different from the second crystal orientation direction, and the first part and the second part are electrically connected in parallel.

11. The resistance circuit according to claim 1, wherein an aspect ratio of the first P-type diffusion layer resistance element is equal to or higher than two.

12. An oscillation circuit comprising:
a semiconductor substrate;
a capacitor that is formed on a principal surface of the semiconductor substrate; and
a resistance circuit that is formed on the principal surface of the semiconductor substrate, an oscillating frequency of the oscillation circuit being set by a capacitance value of the capacitor and a resistance value of the resistance circuit, wherein the resistance circuit includes:
an N-type resistance section that is formed on the principal surface of the semiconductor substrate; and a P-type resistance section that is formed on the principal surface of the semiconductor substrate and that is electrically connected in series to the N-type resistance section, the N-type resistance section has a first N-type diffusion layer resistance element and a second N-type diffusion layer resistance element that are disposed to form a right angle with respect to each other and that are electrically connected in series, the P-type resistance section has a first P-type diffusion layer resistance element and a second P-type diffusion layer resistance element that are disposed to form the right angle with respect to each other and that are electrically connected in series, the first N-type diffusion layer resistance element is disposed along a second crystal orientation direction of the semiconductor substrate, the second crystal orientation direction being different from a first crystal orientation direction of the semiconductor substrate, the first crystal orientation direction being a direction in which a stress sensitivity based on a piezoresistance coefficient becomes maximum, and the first P-type diffusion layer resistance element is disposed along a direction different from the second crystal orientation direction.

13. An in-vehicle sensor apparatus comprising:

a semiconductor chip that includes an oscillation circuit having an oscillating frequency set by a capacitance value of a capacitor and a resistance value of a resistance circuit;

a sensor element that includes a detection section detecting an electrical characteristic in response to a physical quantity;

a chip package that encapsulates the semiconductor chip and the sensor element by a first resin in such a manner as to make the detection section into an exposed state; and a housing that encapsulates part of surroundings of the chip package by a second resin in such a manner as to make the detection section into the exposed state, wherein the oscillation circuit includes:

a semiconductor substrate;

the capacitor that is formed on a principal surface of the semiconductor substrate; and the resistance circuit that is formed on the principal surface of the semiconductor substrate, the resistance circuit includes:

an N-type resistance section that is formed on the principal surface of the semiconductor substrate; and a P-type resistance section that is formed on the principal surface of the semiconductor substrate and that is electrically connected in series to the N-type resistance section, the N-type resistance section has a first N-type diffusion layer resistance element and a second N-type diffusion layer resistance element that are disposed to form a right angle with respect to each other and that are electrically connected in series, the P-type resistance section has a first P-type diffusion layer resistance element and a second P-type diffusion layer resistance element that are disposed to form the right angle with respect to each other and that are electrically connected in series, the first N-type diffusion layer resistance element is disposed along a second crystal orientation direction of the semiconductor substrate, the second crystal orientation direction being different from a first crystal orientation direction of the semiconductor substrate, the first crystal orientation direction being a direction in which a stress sensitivity based on a piezoresistance coefficient becomes maximum, and the first P-type diffusion layer resistance element is disposed along a direction different from the second crystal orientation direction.

* * * * *